United States Patent
Choi et al.

(10) Patent No.: US 10,684,045 B2
(45) Date of Patent: Jun. 16, 2020

(54) THERMOELECTRIC MODULE AND REFRIGERATOR HAVING A THERMOELECTRIC MODULE

(71) Applicant: LG ELECTRONICS INC., Seoul (KR)

(72) Inventors: Jeehoon Choi, Seoul (KR); Heayoun Sul, Seoul (KR); Seokhyun Kim, Seoul (KR); Minkyu Oh, Seoul (KR); Hyoungkeun Lim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 190 days.

(21) Appl. No.: 15/788,164

(22) Filed: Oct. 19, 2017

(65) Prior Publication Data

US 2018/0112895 A1    Apr. 26, 2018

(30) Foreign Application Priority Data

Oct. 25, 2016    (KR) .................. 10-2016-0139365

(51) Int. Cl.
*F25B 21/02*    (2006.01)
*F28D 15/02*    (2006.01)
*H01L 35/28*    (2006.01)

(52) U.S. Cl.
CPC .......... *F25B 21/02* (2013.01); *F28D 15/0275* (2013.01); *F25B 2321/023* (2013.01); *F25B 2321/0251* (2013.01); *H01L 35/28* (2013.01)

(58) Field of Classification Search
CPC .......... F25B 21/00–04; F25B 2321/023; F25B 2321/0251; H01L 35/28
See application file for complete search history.

(56) References Cited

U.S. PATENT DOCUMENTS 5,381,672 A *   1/1995   Haasis ................ A47F 3/04
                                                 62/407
8,854,819 B2 * 10/2014   Chen ................... H01L 23/427
                                                 165/165

(Continued)

FOREIGN PATENT DOCUMENTS

| CN | 203943523 | 11/2014 |
| KR | 10-2010-0057216 | 5/2010 |
| WO | WO 2015/144079 | 10/2015 |

OTHER PUBLICATIONS

European Search Report dated Feb. 28, 2018 issued in Application No. 17197728.3.

*Primary Examiner* — Keith M Raymond
*Assistant Examiner* — Webeshet Mengesha
(74) *Attorney, Agent, or Firm* — KED & Associates LLP

(57) ABSTRACT

A thermoelectric module that has a thermoelectric element, an axial flow fan, and a heat sink and that is installed at a rear wall of the storage chamber to cool the storage chamber. The heat sink has a base configured to come in surface contact with the thermoelectric element, fins protruding from the base toward the axial flow fan and spaced apart from each other, and heat pipes having base passing portions passing through the base and fin passing portions passing through the fins and configured to transfer heat from the base to the fins. Each of the fins includes a first part arranged opposite to the hub and a second part disposed at one of both sides of the first part to face the vanes and protruding further from the base toward the axial flow fan than the first part.

15 Claims, 12 Drawing Sheets

(56) References Cited

U.S. PATENT DOCUMENTS

2010/0126185 A1    5/2010  Cho et al.
2013/0276465 A1*  10/2013  Shin .................. F25B 21/02
                                                62/3.6
2014/0116659 A1    5/2014  Lin et al.

* cited by examiner

THERMOELECTRIC MODULE AND REFRIGERATOR HAVING A THERMOELECTRIC MODULE

CROSS-REFERENCE TO RELATED APPLICATION(S)

Pursuant to 35 U.S.C. § 119(a), this application claims the benefit of earlier filing date and right of priority to Korean Application No. 10-2016-0139365, filed in Korea on Oct. 25, 2016, the contents of which is incorporated by reference herein in its entirety.

BACKGROUND

1. Field

A thermoelectric module and a refrigerator having the thermoelectric module are disclosed herein.

2. Background

A thermoelectric element may refer to an element that absorbs and generates heat using the Peltier effect. According to the Peltier effect, when a voltage is applied to both ends of the element, an endothermic phenomenon occurs at one end and an exothermic phenomenon at the other end.

A refrigerator may include a food storage space capable of blocking heat penetrating from the outside by a door and a cabinet which are filled with a heat insulating material, an evaporator configured to absorb heat inside the food storage space, and a refrigeration apparatus including a heat dissipating device to dissipate heat collected outside the food storage space to maintain the food storage space at a low temperature range where it is difficult for microorganisms to survive and proliferate, thereby storing food for a long time without deterioration.

The refrigerator may have a refrigerating chamber storing food in a temperature region above zero degrees Celsius and a freezing chamber storing food in a temperature region below zero degrees Celsius. Depending on positions of the refrigerating chamber and the freezing chamber, the refrigerator may be classified into a top freezer refrigerator having an upper freezing chamber and a lower refrigerating chamber positioned therein, a bottom freezer refrigerator having a lower freezing chamber and an upper refrigerating chamber positioned therein, or a side-by-side refrigerator having a left freezing chamber and a right refrigerating chamber positioned therein, for example. Also, in order for a user to easily position and withdraw food stored in the food storage space, the refrigerator may have a plurality of shelves and drawers in the food storage space.

When a freezing apparatus that freezes the food storage space is implemented as a refrigeration cycle apparatus including a compressor, a condenser, an expander, and an evaporator, for example, it is difficult to block vibration and noise generated in the compressor. According to recent developments, an installation place of a refrigerator such as a cosmetic refrigerator is no longer limited only to a kitchen and may also be a living room or a bedroom. If noise and vibration are not blocked, it may cause a great inconvenience to users.

Applying a thermoelectric element to a refrigerator can cool a food storage space without a refrigeration cycle apparatus. In this regard, Korean Patent Publication No. 10-2010-0057216 (Oct. 31, 2010), which is herein incorporated by reference in its entirety, discloses a configuration to cool an ice making chamber using a thermoelectric element. In particular, a thermoelectric element does not generate noise and vibration unlike a compressor. Accordingly, by applying a thermoelectric element to a refrigerator, it may be possible to solve problems associated with noise and vibration even when the refrigerator is installed in a space other than a kitchen.

However, a thermoelectric element may have a limitation in keeping a food storage space at a low temperature region due to insufficient cooling performance, compared to a refrigeration cycle apparatus. Therefore, in order to apply a thermoelectric element to a refrigerator, it is necessary to improve cooling performance of the thermoelectric element.

The above references are incorporated by reference herein where appropriate for appropriate teachings of additional or alternative details, features and/or technical background.

BRIEF DESCRIPTION OF THE DRAWINGS

Embodiments will be described in detail with reference to the following drawings in which like reference numerals refer to like elements, and wherein.

DETAILED DESCRIPTION

Figure 1:
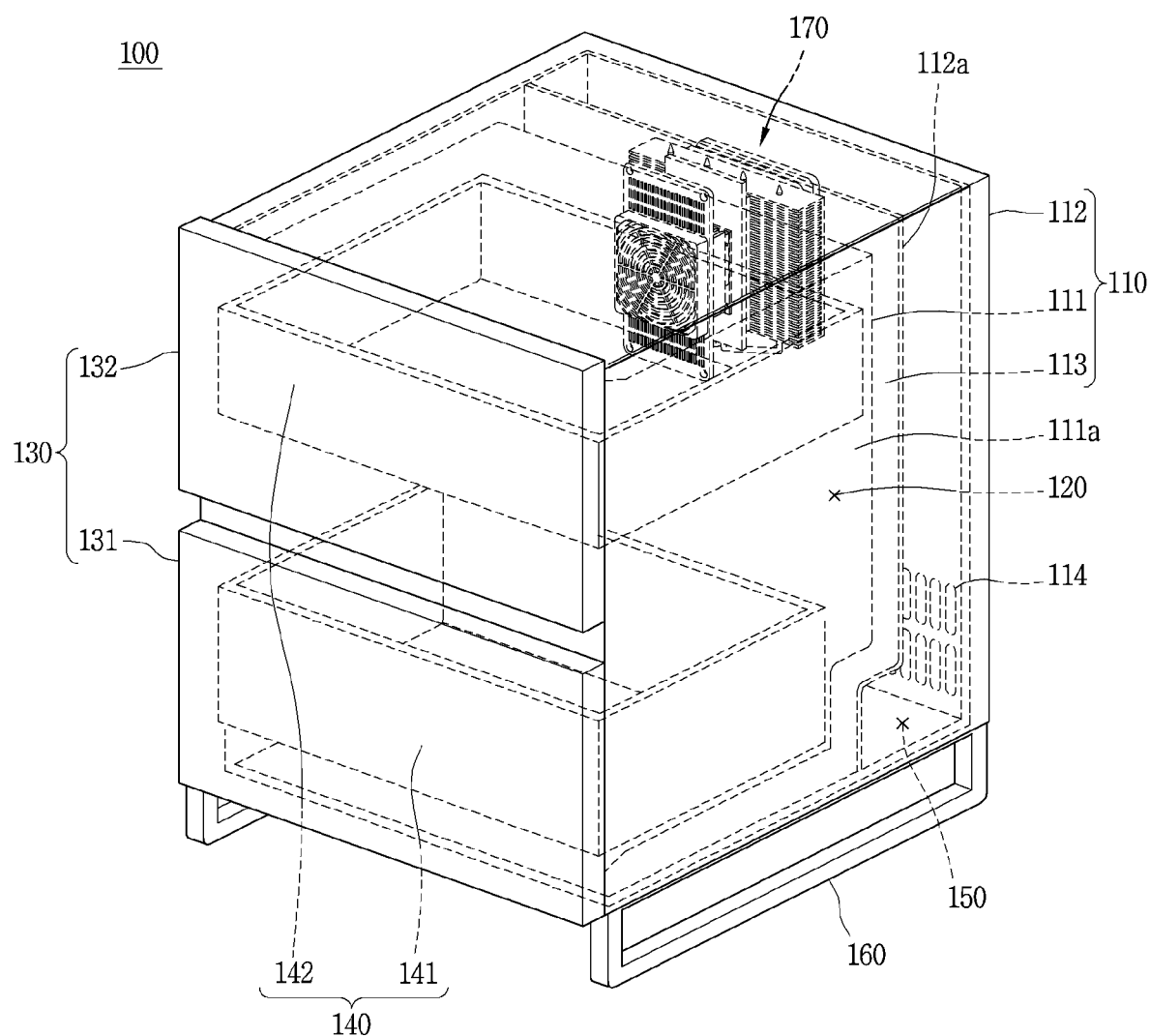
FIG. 1 is a conceptual view showing an example of a refrigerator having a thermoelectric module.

FIG. 1 is a conceptual view showing an example of a refrigerator 100 having a thermoelectric module 170. The refrigerator 100 may be used as both a small side table and a refrigerator. The small side table may refer to a small table that is placed next to a bed or at a side of a kitchen and used to hold various belongings. The small side table may have a top surface on which a stand may be placed and an inside in which small items may be accommodated. The refrigerator 100 may store food therein at low temperature while maintaining an original function of the small side table on which a stand may be placed.

Referring to FIG. 1, an outer appearance of the refrigerator 100 may be formed by a cabinet 110 and a door 130. The cabinet 110 may include an inner case 111, an outer case 112, and a heat insulating material (or insulation) 113. The inner case 111 may be installed inside the outer case 112 and may form a storage chamber 120 to store food at low temperature. The refrigerator 100 may have a limited size so that the refrigerator 100 may be used as a small side table, and the size of the storage chamber 120 formed by the inner case 111 may be limited to about 200 L or less.

The outer case 112 may form an outer appearance having a shape of the small size table. The door 130 may be installed at the front of the refrigerator, and the outer case 112 may form an outer appearance except for the front of the refrigerator 100. A top surface of the outer case 112 may be flat so that small items may be placed on the top surface.

The insulation 113 may be provided between the inner case 111 and the outer case 112. The insulation 113 may suppress heat from being transferred from the outside, which may be relatively hot, to the storage chamber 120, which may be relatively cold.

Figure 2:
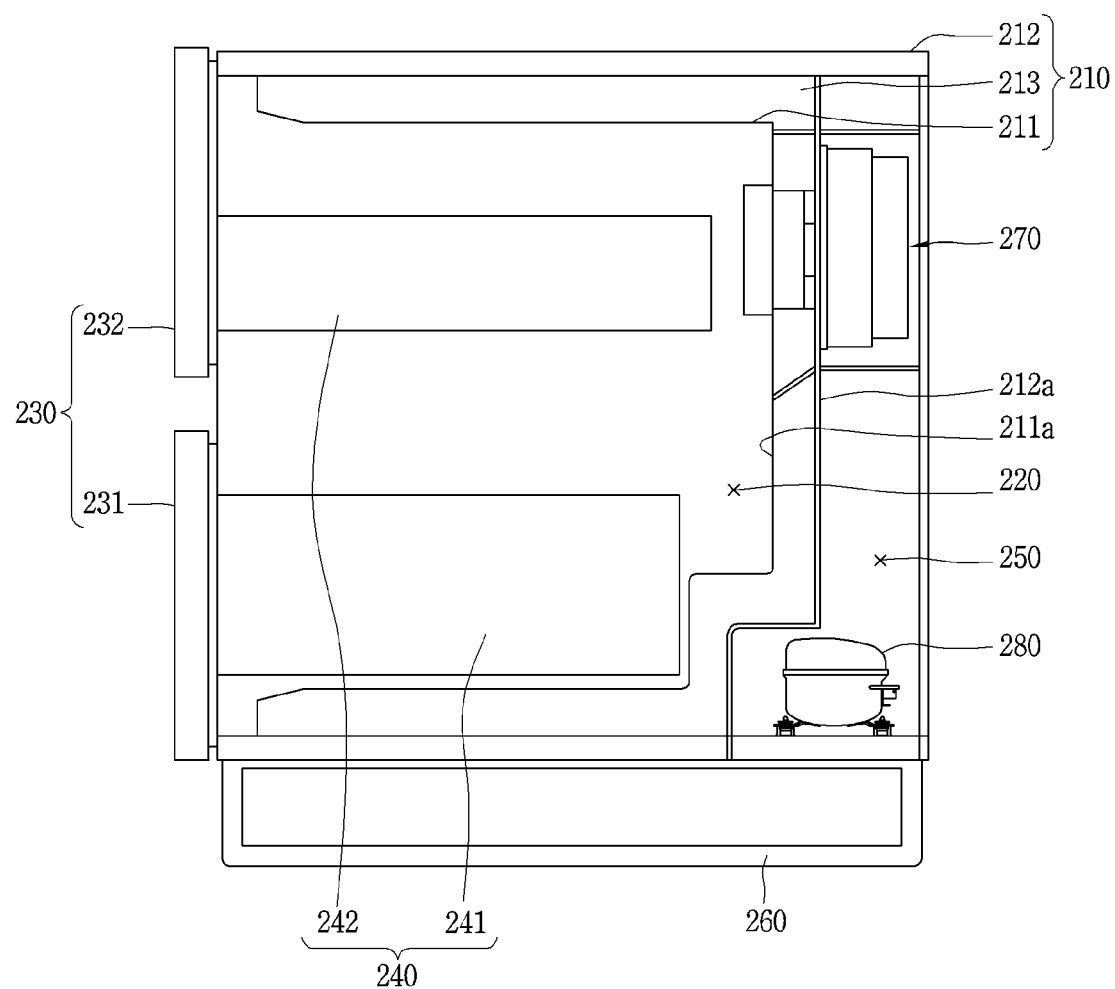
FIG. 2 is a side sectional view of a refrigerator having a thermoelectric module.

The door 130 may be installed at the front of the cabinet 110. The door 130 may form an external appearance together with the cabinet 110. The door 130 may be configured to open or close the storage chamber 120 by sliding movement, such as a drawer type movement. The door may be provided in the refrigerator 100 as two doors 131 and 132, which may be vertically positioned as shown in FIGS. 1 and 2.

A drawer 140 to efficiently utilize space may be installed in the storage chamber 120. The drawer 140 may form a food storage region in the storage chamber 120. The drawer 140 may be coupled to the door 130 and may be capable of being drawn from the storage chamber 120 by the sliding movement of the door 130.

Two drawers 141 and 142 may be vertically positioned, like the door 130. The drawers 141 and 142 may be coupled to the doors 131 and 132, respectively. The drawers 141 and 142 coupled to the doors 131 and 132 may be withdrawn from the storage chamber 120 when the doors 131 and 132 are withdrawn from the storage chamber 120.

A machine chamber 150 may be formed behind the storage chamber 120. The outer case 112 may include a partition 112a to form the machine chamber 150. In this case, the insulation 113 may be provided between the partition 112a and the inner case 111. Various electrical and machinery components to drive the refrigerator 100 may be installed in the machine chamber 150.

A support fixture (or support leg) 160 may be installed at a bottom surface of the cabinet 110. As shown in FIG. 1, the support leg 160 may separate the cabinet 110 from a floor where the refrigerator 100 is located. A user may access a refrigerator 100 installed in a bedroom, for example, more frequently than a refrigerator 100 installed in a kitchen. Accordingly, the refrigerator 100 may be separated from the floor in order to easily clean dust, for example, accumulated between the refrigerator 100 and the floor. Since the support leg 160 may separate the cabinet 110 from the floor where the refrigerator 100 is to be installed, this structure may facilitate the cleaning.

The refrigerator 100 may operate 24 hours per day, unlike other home appliances. Accordingly, when the refrigerator 100 is placed next to a bed, noise and vibration may be transferred from the refrigerator 100 to a person who sleeps on the bed and thus interfere with his/her sleep, especially at night. Therefore, low-noise and low-vibration performance of the refrigerator 100 should be sufficiently secured so that the refrigerator 100 may be placed next to a bed to act as a small side table and a refrigerator.

When a refrigeration cycle apparatus including a compressor is used to cool the storage chamber 120 of the refrigerator 100, it may be difficult to fundamentally block noise and vibration generated by the compressor. Accordingly, the refrigeration cycle apparatus may be restrictively used to secure low-noise and low-vibration performance, and the refrigerator 100 according to the present disclosure may cool the storage chamber 120 using a thermoelectric module 170.

The thermoelectric module 170 may be installed in or at a rear wall 111a of the storage chamber 120 and configured to cool the storage chamber 120. The thermoelectric module 170 may include a thermoelectric element. The thermoelectric element may be an element that absorbs and generates heat using the Peltier effect, as described above. When a heat absorber of the thermoelectric element is arranged toward the storage chamber 120 and a heat generator of the thermoelectric element is arranged toward the outside of the refrigerator 100, the storage chamber 120 may be cooled by activating the thermoelectric element.

FIG. 2 is a side-sectional view of a refrigerator 200 including a thermoelectric module 270. The refrigerator 200 may selectively include a refrigeration cycle apparatus. In order to implement the refrigerator 200 as a low-noise and low-vibration refrigerator, a storage chamber 220 may be cooled by the thermoelectric module 270. However, the refrigerator 200 according to the present disclosure may not exclude a refrigeration cycle apparatus.

For example, the refrigerator 200 may include both of the thermoelectric module 270 and the refrigeration cycle apparatus. The storage chamber 220 may be cooled by the thermoelectric module 270 and/or the refrigeration cycle apparatus in an environment that does not interfere with a user's sleep, for example, during daytime and by only the thermoelectric module 270 at night. Alternatively, when rapid cooling is required by the refrigerator 200, the thermoelectric module 270 and the refrigeration cycle apparatus may be simultaneously activated.

The refrigeration cycle apparatus may include individual devices such as a compressor 280, a condenser, an inflator, and an evaporator, for example, and the individual devices may be connected to each other by piping. When the refrigerator 200 includes the refrigeration cycle apparatus, the compressor and the condenser may be installed in a machine chamber 250. FIG. 2 shows the compressor 280 included in the refrigeration cycle apparatus. Also, a hole 114 (see FIG. 1) to discharge heat generated by the condenser to the outside may be formed in an outer case 212.

When one of the two drawers 241 and 242 of the refrigerator 200, which is placed at a lower portion, is referred to as a first drawer 241, and the other of the two drawers 241 and 242, which is placed at an upper portion, is referred to as a second drawer 242, the thermoelectric module 270 may be installed higher than a position between the first drawer 241 and the second drawer 242, due to the fact that hot air rises and cold air drops. For example, as shown in FIG. 2, the thermoelectric module 270 may face the second drawer 242. Cold air formed by the thermoelectric module 270 installed at this position may drop down in the storage chamber 220 to be evenly distributed throughout the storage chamber 220.

Reference numeral 211, which is not described in FIG. 2, indicates an inner case, reference numeral 211a indicates a rear wall, reference numeral 212a indicates a partition, reference numeral 213 indicates a heat insulating material (or insulation), reference numeral 230 indicates a door, reference numeral 231 indicates a first door, reference numeral 232 indicates a second door, and reference numeral 260 indicates a support fixture. Descriptions thereof can be understood with reference to the description of FIG. 1.

Figure 3:
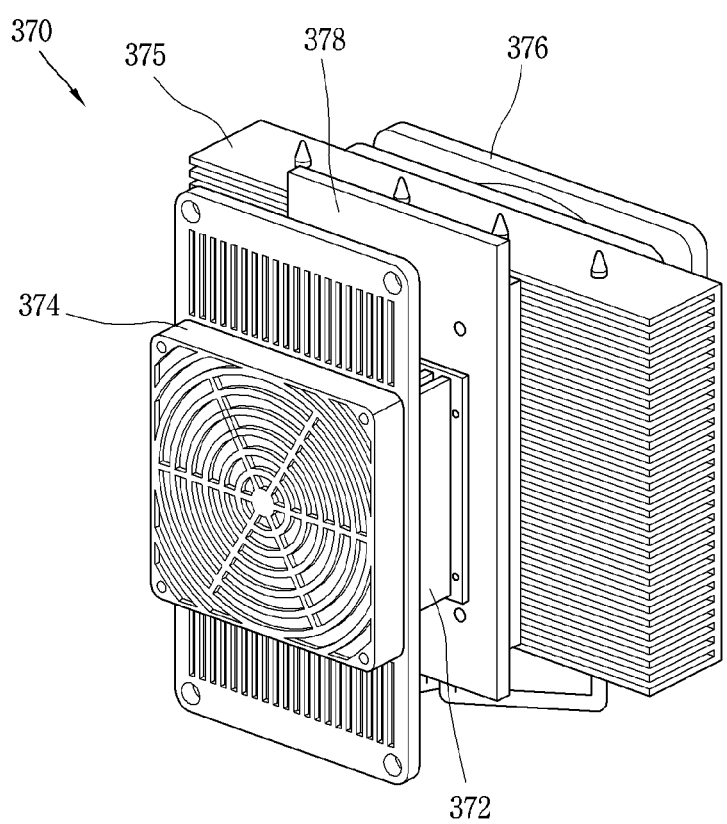
FIG. 3 is a perspective view showing a thermoelectric module.
Figure 4:
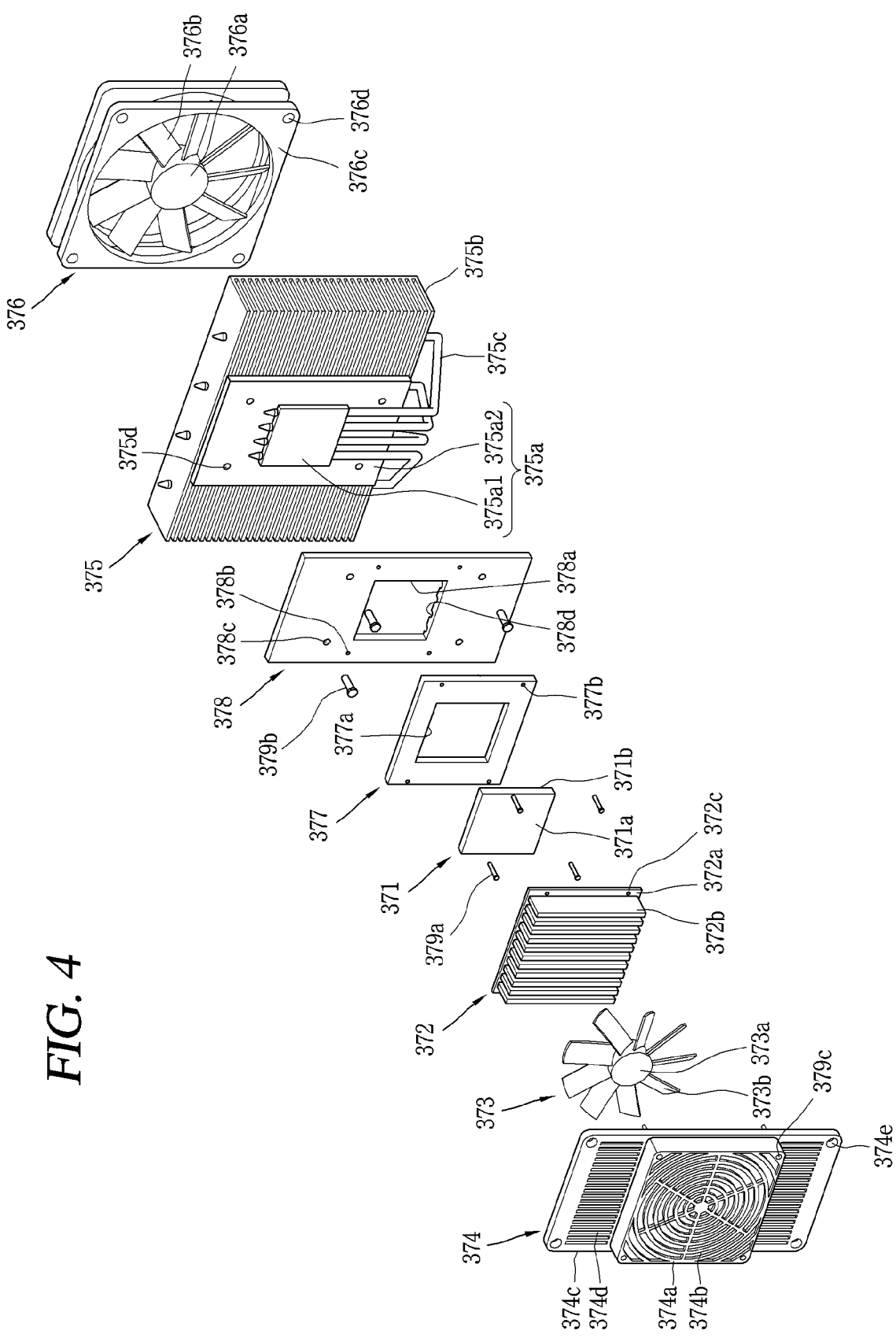
FIG. 4 is an exploded perspective view showing the thermoelectric module of FIG. 3.

A detailed configuration of the thermoelectric module 270 will be described with reference to FIGS. 3 and 4. FIG. 3 is a perspective view showing a thermoelectric module 370. FIG. 4 is an exploded perspective view showing the thermoelectric module 370 of FIG. 3.

The thermoelectric module 370 may include a thermoelectric element 371, a heat absorption heat sink 372, a first axial flow fan 373, a heat dissipation heat sink 375, a second axial flow fan 376, and a heat insulating material (or insulation) 377. The thermoelectric module 370 may operate between a first region and a second region that are distinct from each other. Heat may be absorbed from any one of the first region and the second region and dissipated to the other.

The first region and the second region may indicate regions that are spatially separated by a boundary. When the thermoelectric module 370 is applied to the refrigerator 100 (see FIG. 1) or 200 (see FIG. 2), the first region may correspond to any one of the storage chamber 120 (see FIG. 1) or 220 (see FIG. 2) and the outside of the refrigerator 100 (see FIG. 1) or 200 (see FIG. 2), and the second region may correspond to the other. The thermoelectric element 371 may be formed by forming a PN junction with a p-type semiconductor and an n-type semiconductor and connecting a plurality of PN junctions in series.

The thermoelectric element 371 may have a heat absorption unit or plate 371a and a heat dissipation unit or plate 371b that face opposite directions. In order to effectively transfer heat, the heat absorption plate 371a and the heat dissipation plate 371b may be formed as a surface contactable shape. Accordingly, the heat absorption plate 371a may be named a heat absorption surface, and the heat dissipation plate 371b may be named a heat dissipation surface. Also, the heat absorption plate 371a and the heat dissipation plate 371b may be generalized and named a first part and a second part or a first surface and a second surface, respectively. The naming is for convenience of description and does not limit the scope of the disclosure.

The heat absorption heat sink 372 may contact the heat absorption plate 371a of the thermoelectric element 371. The heat absorption heat sink 372 may exchange heat with a first region. The first region may correspond to the storage chamber 120 (see FIG. 1) or 220 (see FIG. 2) of the refrigerator 100 (see FIG. 1) or 200 (see FIG. 2), and the heat absorption heat sink 372 may exchange heat with air inside the storage chamber 120 (see FIG. 1) or 220 (see FIG. 2).

The first axial flow fan 373 may be installed to face the heat absorption heat sink 372 and configured to generate air flow to facilitate the exchange of heat performed by the heat absorption heat sink 372. Since an exchange of heat is a natural phenomenon, the heat absorption heat sink 372 may exchange heat with air of the storage chamber 120 (see FIG. 1) or 220 (see FIG. 2). However, as the thermoelectric module 370 includes the first axial flow fan 373, an exchange of heat performed by the heat absorption heat sink 372 may be further facilitated.

The first axial flow fan 373 may be surrounded by a cover 374. The cover 374 may include several parts including a part or shroud 374a surrounding the first axial flow fan 373. A plurality of holes 374b may be formed in the shroud 374a surrounding the first axial flow fan 373 so that air inside the storage chamber 120 (see FIG. 1) or 220 (see FIG. 2) may pass through the cover 374.

Also, the cover 374 may have a structure capable of being fastened to the rear wall 111a (see FIG. 1) or 211a (see FIG. 2) of the storage chamber 120 (see FIG. 1) or 220 (see FIG. 2). As an example, FIGS. 3 and 4 show a structure in which the cover 374 has a part or plate 374c extending from both sides of the shroud 374a surrounding the first axial flow fan 373 and a screw hole 374e into which a screw may be inserted may be formed in the plate 374c. Furthermore, a screw 379c may be inserted into the part surrounding the first axial flow fan 373 to additionally fasten the cover 374 to the rear wall 111a (see FIG. 1) or 211a (see FIG. 2). The holes 374b and holes 374d may be formed in the shroud 374a surrounding the first axial flow fan 373 and the plate 374c to allow air to pass through.

The heat dissipation heat sink 375 may contact the heat dissipation plate 371b of the thermoelectric element 371. The heat dissipation heat sink 375 may exchange heat with a second region. The second region may correspond to an outer space of the refrigerator 100 (see FIG. 1) or 200 (see FIG. 2), and the heat dissipation heat sink 375 may exchange heat with air outside the refrigerator 100 (see FIG. 1) or 200 (see FIG. 2).

The second axial flow fan 376 may face the heat dissipation heat sink 375 and may generate air flow to facilitate the exchange of heat performed by the heat dissipation heat sink 375. The second axial flow fan 376 may facilitate the exchange of heat performed by the heat dissipation heat sink 375 in the same manner as the first axial flow fan 373 facilitates the exchange of heat performed by the heat absorption heat sink 372.

The second axial flow fan 376 may optionally have a shroud 376c. The shroud 376c may guide the air flow. For example, as shown in FIG. 4, the shroud 376c may be spaced apart from vanes 376b and formed to surround the vanes 376b. Additionally, a screw hole 376d may be formed in the shroud 376c to fasten the second axial flow fan 376.

The heat absorption heat sink 372 and the first axial flow fan 373 may correspond to a heat absorption side of the thermoelectric module 370. Also, the heat dissipation heat sink 375 and the second axial flow fan 376 may correspond to a heat dissipation side of the thermoelectric module 370. The heat absorption heat sink 372 and the heat dissipation heat sink 375 may include bases 372a and 375a and fins 372b and 375b, respectively.

The bases 372a and 375a may be in surface contact with the thermoelectric element 371. The base 372a of the heat absorption heat sink 372 may be in surface contact with the heat absorption plate 371a of the thermoelectric element 371, and the base 375a of the heat dissipation heat sink 375 may be in surface contact with the heat dissipation plate 371b of the thermoelectric element 371.

Since thermal conductivity increases with an increase in heat transfer area, the bases 372a and 375a and the thermoelectric element 371 may be in surface contact with each other. Also, a thermal conductor (a thermal grease or a thermal compound) may be used to increase thermal conductivity by filling a fine gap between the thermoelectric element 371 and the bases 372a and 375a.

The fins 372b and 375b may respectively protrude from the bases 372a and 375a to exchange heat with air of the first region or air of the second region. Since the first region may correspond to the storage chamber 120 (see FIG. 1) or 220 (see FIG. 2), and the second region may correspond to the outside of the refrigerator 100 (see FIG. 1) or 200 (see FIG. 2), the fins 372b of the heat absorption heat sink 372 may exchange heat with the air of the storage chamber 120 (see FIG. 1) or 220 (see FIG. 2), and the fins 375b of the heat dissipation heat sink 375 may exchange heat with air outside of the refrigerator 100 (see FIG. 1) or 200 (see FIG. 2).

The fins 372b and 375b may be separate from each other. By having the fins 372b and 375b arranged separately from each other, a heat exchange area may be increased. When the fins 372b and 375b contact each other, there may be no heat exchange area between the fins 372b and 375b. However, when the fins 372b and 375b are separated from each other, there may be heat exchange areas between the fins 372b and 375b. Since thermal conductivity increases with increase in heat transfer area, the area of the fins exposed from the first region and the second region may increase in order to enhance heat transfer performance of a heat sink.

Also, in order to implement a sufficient cooling effect of the heat absorption heat sink 372 corresponding to the heat absorption side, the heat dissipation heat sink 375 corresponding to the heat dissipation side may have greater thermal conductivity than the heat absorption heat sink 372. This is because sufficient heat may be absorbed from the heat absorption plate 371a when heat is quickly dissipated to the heat dissipation plate 371b of the thermoelectric element 371, due to the fact that the thermoelectric element 371 is not a simple thermal conductor but an element having a first side for heat absorption and a second side for heat dissipation. Accordingly, heat may be powerfully dissipated by the heat dissipation plate 371b of the thermoelectric element 371 so that the heat absorption plate 371a may achieve sufficient cooling.

Considering this point, when heat is absorbed by the heat absorption heat sink 372 and dissipated by the heat dissipation heat sink 375, the heat dissipation heat sink 375 may have a larger heat exchange area than the heat absorption heat sink 372. Assuming that the entire heat exchange area of the heat absorption heat sink 372 is used to exchange heat, the heat exchange area of the heat dissipation heat sink 375 may be three times that of the heat absorption heat sink 372 or more.

This may be applied to both the first axial flow fan 373 and the second axial flow fan 376. In order to achieve a sufficient cooling effect at the absorption side, the volume and speed of air flow formed by the second axial flow fan 376 may be greater than the volume and speed of air flow formed by the first axial flow fan 373.

Since the heat dissipation heat sink 375 requires a larger heat exchange area than the heat absorption heat sink 372, the base 375a and the fins 375b may have a larger area than the base 372a and the fins 372b of the heat absorption heat sink 372. Furthermore, the heat dissipation heat sink 375 may have a heat pipe 375c in order to quickly distribute heat transferred to the base 375a of the heat dissipation heat sink 375 to the fins.

The heat pipe 375c may receive a heat transfer fluid therein and may have a first end passing through the base 375a and a second end passing through the fins 375b. The heat pipe 375c may be a device that transfers heat from the base 375a to fins 375b through vaporization of the heat transfer fluid received therein. When the heat pipe 375c is not present, an exchange of heat may be concentrated on only fins 375b adjacent to the base 375a. This is because heat may not be sufficiently distributed to those fins 375b that are far from the base 375a.

However, when the heat pipe 375c is present, heat may be exchanged with all the fins 375b of the heat dissipation heat sink 375. The heat pipe 375c may evenly distribute the heat of the base 375a even to the fins 375b that are arranged relatively far from the base 375a.

The base 375a of the heat dissipation heat sink 375 may be formed in two layers to have the heat pipe 375c built therein. A first layer 375a1 of the base 375a may surround a first side of the heat pipe 375c, a second layer 375a2 of the base 375a may surround a second side of the heat pipe 375c, and the two layers 375a1 and 375a2 may face each other.

The first layer 375a1 may contact the heat dissipation plate 371b of the thermoelectric element 371 and may have a same or similar size as the thermoelectric element 371. The second layer 375a2 may be connected with the fins 375b, and the fins 375b may protrude from the second layer 375a2. The second layer 375a2 may have a larger size than the first layer 375a1. Also, a first end of the heat pipe 375c may be arranged between the first layer 375a1 and the second layer 375a2.

The insulation 377 may be installed between the heat absorption heat sink 372 and the heat dissipation heat sink 375. The insulation 377 may surround a border of the thermoelectric element 371. For example, as shown in FIG. 4, a hole 377a may be formed in the insulation 377, and the thermoelectric element 371 may be provided in the hole 377a.

As described above, the thermoelectric module 370 may not be a simple thermal conductor but an element that cools the storage chamber 120 (see FIG. 1) or 220 (see FIG. 2) through heat absorption and heat dissipation that are performed at a first side and a second side of the thermoelectric element 371. Accordingly, the heat of the heat absorption heat sink 372 may not be directly transferred to the heat dissipation heat sink 375. The direct heat transfer may cause a difference in temperature between the heat absorption heat sink 372 and the heat dissipation heat sink 375 to decrease, thus reducing performance of the thermoelectric element 371. In order to prevent such a phenomenon, the insulation 377 may block the direct heat transfer between the heat absorption heat sink 372 and the heat dissipation heat sink 375.

A joint plate 378 may be provided between the heat absorption heat sink 372 and the heat insulating material 377 or between the heat dissipation heat sink 375 and the heat insulating material 377. The joint plate 378 may be used to fasten the heat absorption heat sink 372 and the heat dissipation heat sink 375, and the heat absorption heat sink 372 and the heat dissipation heat sink 375 may be screwed to the joint plate 378.

The joint plate 378 may surround a border of the thermoelectric element 371 together with the heat insulating material 377. The joint plate 378 may have a hole 378a corresponding to the thermoelectric element 371 like the heat insulating material 377, and the thermoelectric element 371 may be provided in the hole 378a. However, the joint plate 378 may not be an essential element of the thermoelectric module 370 and may be replaced by another element to fasten the heat absorption heat sink 372 and the heat dissipation heat sink 375.

A plurality of screw holes 378b and 378c may be formed in the joint plate 378 to fasten the heat absorption heat sink 372 and the heat dissipation heat sink 375. A plurality of screw holes 372c and 377b corresponding to the joint plate 378 may be formed in the heat absorption heat sink 372 and the heat insulating material 377. The heat absorption heat sink 372 may be fastened to the joint plate 378 by sequentially inserting a screw 379a into the three screw holes 372c, 377b, and 378b. A screw hole 375d corresponding to the joint plate 378 may be formed even in the heat dissipation heat sink 375. The heat dissipation heat sink 375 may be fastened to the joint plate 378 by sequentially inserting the screw 379 into the two screw holes 378c and 375d.

A recess part or recess 378d may be formed in the joint plate 378 to accommodate the first side of the heat pipe 375c.

The recess 378*d* may correspond to the heat pipe 375*c* and may partially surround the heat pipe 375*c*. Since the heat dissipation heat sink 375 may have the heat pipe 375*c*, but the joint plate 378 may have the recess 378*d*, the heat dissipation heat sink 375 may be brought into close contact with the joint plate 378, and also the entire thickness of the thermoelectric module 370 may be made thinner.

The first axial flow fan 373 and the second axial flow fan 376 that have been described above may include hubs 373*a* and 376*a* and vanes 373*b* and 376*b*, respectively. The hubs 373*a* and 376*a* may be coupled to a rotary shaft. The vanes 373*b* and 376*b* may be radially installed around the hubs 373*a* and 376*a*.

The axial flow fans 373 and 376 may be distinct from centrifugal fans. The axial flow fans 373 and 376 may generate air flow in rotary shaft directions of the axial flow fans 373 and 376 to cause air to enter and then exit in the rotary shaft directions. On the other hand, centrifugal fans may generate air flow in centrifugal directions (or circumferential directions) to cause air to enter in rotary shaft directions of the centrifugal fans and then exit in the centrifugal directions.

The axial flow fans 373 and 376 may have the hubs 373*a* and 376*a* and the vanes 373*b* and 373*b* to generate winds in the rotary shaft directions. However, since the hubs 373*a* and 376*a* rotate in place, a dead zone phenomenon may occur behind the hubs 373*a* and 376*a*. The dead zone phenomenon will be described with reference to FIGS. 5 and 6.

Figure 5:
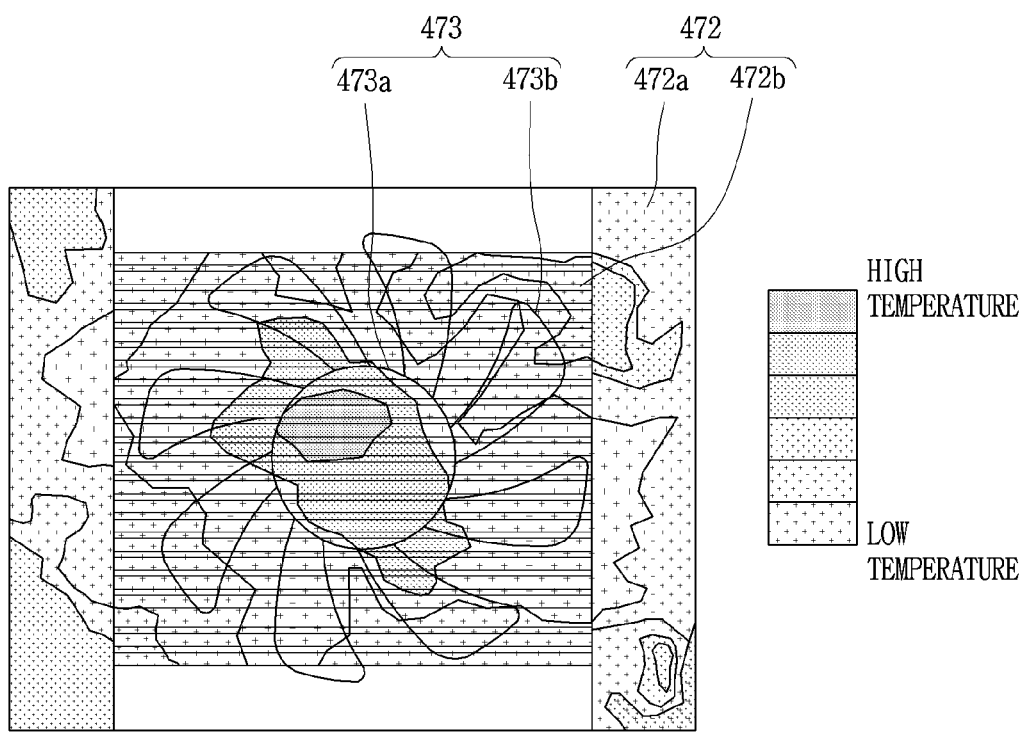
FIG. 5 is a conceptual view illustrating a dead zone.
Figure 6:
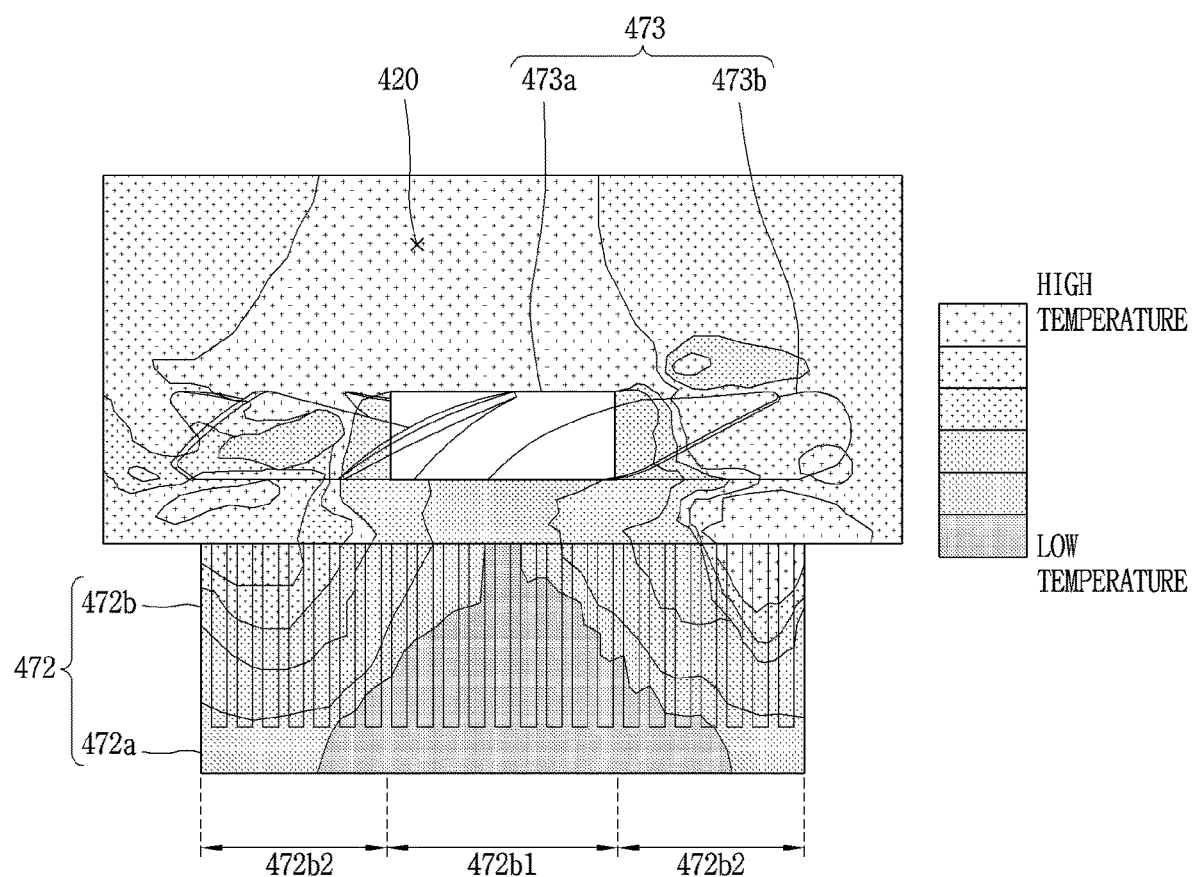
FIG. 6 is another conceptual view illustrating a dead zone.

FIG. 5 is a conceptual view illustrating a dead zone. FIG. 6 is another conceptual view illustrating a dead zone. A dead zone may refer to a region of a heat sink that does not exchange heat. Typically, a heat sink 472 may use a heat transfer area formed by the fins 472*b*, and thermal conductivity may be affected by the heat transfer area. Accordingly, the entire area of the fins 472*b* may exchange heat, and thus it may be possible to maximize the thermal conductivity. However, when a portion of the thermal transfer area formed by the fins 472*b* does not exchange heat, the thermal conductivity may decrease.

In FIGS. 5 and 6, a temperature range is divided into six stages, and the first axial flow fan 473 and the heat absorption heat sink 472 are distinctly displayed for each region of the temperature range. Since heat of a first region 420 may be transferred to the heat absorption heat sink 472, a high temperature being displayed may denote that a corresponding area actively participates in an exchange of heat while a low temperature being displayed may denote that a corresponding area does not substantially participate in the exchange of heat.

Referring to FIGS. 5 and 6, the temperature of fins 472*b*1 provided directly behind the hub 473*a* may be lowest and the temperature of fins 472*b*2 provided behind vanes 473*b* may be relatively high. Accordingly, the fins 472*b*2 provided behind the vanes 473*b* may actively participate in the exchange of heat, and the fins 472*b*1 provided behind the hub 473*a* may not substantially participate in the exchange of heat. From this, it can be seen that a dead zone phenomenon may occurr in the fins 472*b*1 provided behind the hub 473*a*. The dead zone phenomenon having occurred in the fins 472*b*1 provided behind the hub 473*a* may be associated with characteristics of an axial flow fan 473.

The axial flow fan 473 may generate air flow in a rotary shaft direction. However, vanes 473*b* of the axial flow fan 473 may generate air flow, and the hub may rotate in place. Thus, the volume and speed of air blowing directly behind the hub 473*a* may be much smaller than those behind the vanes 473*b*. Accordingly, heat may only be exchanged between the air and the fins 472*b* when air of the first region 420 is brought into contact with the fins 472*b* of the heat absorption heat sink 472 by the first axial flow fan 473. Since air may not come in sufficient contact with the fins 472*b*1 provided behind the hub 473*a*, a dead zone may occur in the fins 472*b*1. The dead zone may gradually increase from the hub 473*a* to the base 472*a*.

Also, the fins 472*b*1 provided behind the hub 473*a* may act as air flow resistance. The fins 472*b*2 provided behind the vanes 473*b* may also act as air flow resistance, but air flow formed by the vanes 473*b* may have a volume and speed that can overcome the resistance. Accordingly, the air flow resistance may not present problems. However, it may be difficult to overcome the resistance formed by the fins 472*b*1 by means of only the volume and speed of air blowing to the back of the hub 473*a*. Such a phenomenon may occur not only in the heat absorption heat sink 472 but also in the heat dissipation heat sink 475.

As long as the thermoelectric module 470 includes the axial flow fan 473 to facilitate the exchange of heat, a large volume and high speed of air may not be supplied to the back of the hub 473*a*. Accordingly, in order to solve such a dead zone problem, the structure of the heat sink 472 should be improved. The present disclosure proposes a new structure of the heat sink in order to improve such a dead zone phenomenon, and the structure of the heat sink will be described below.

Figure 7:
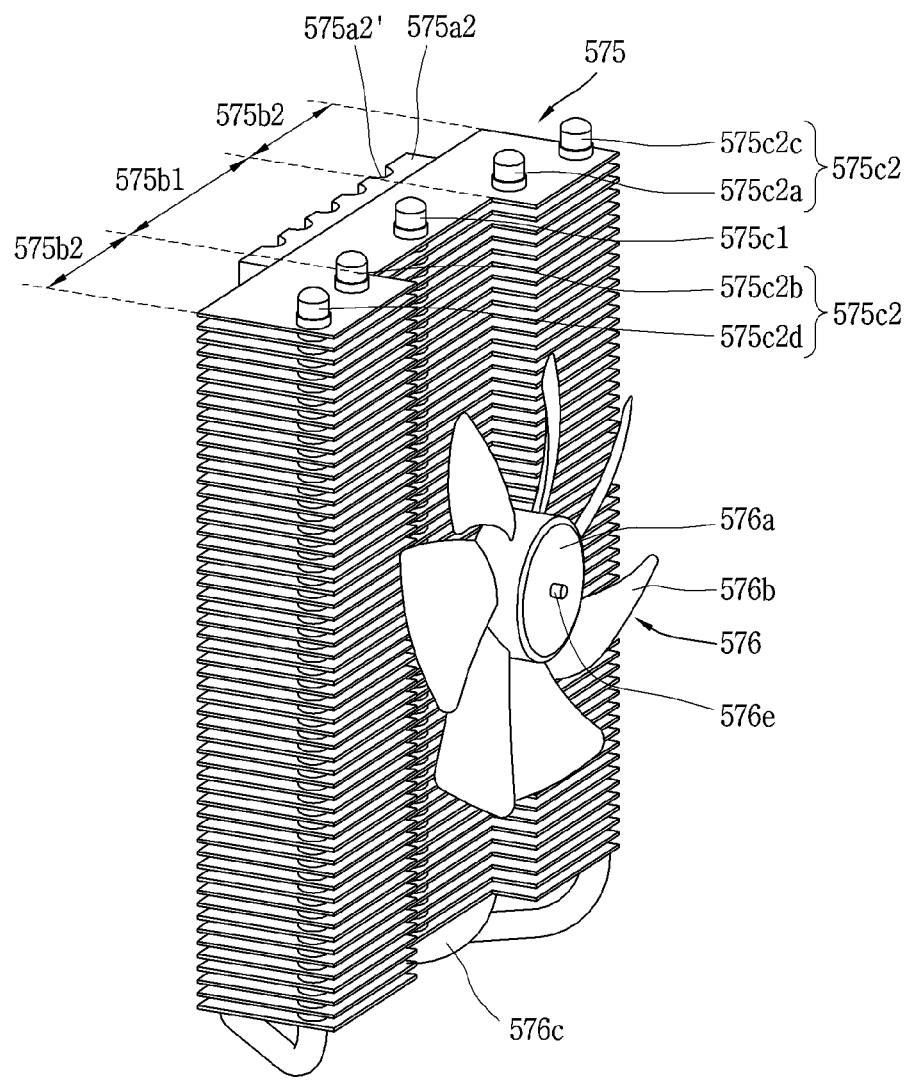
FIG. 7 is a perspective view showing a heat dissipation heat sink and a second axial flow fan of a thermoelectric module according to an embodiment of the present disclosure.
Figure 8:
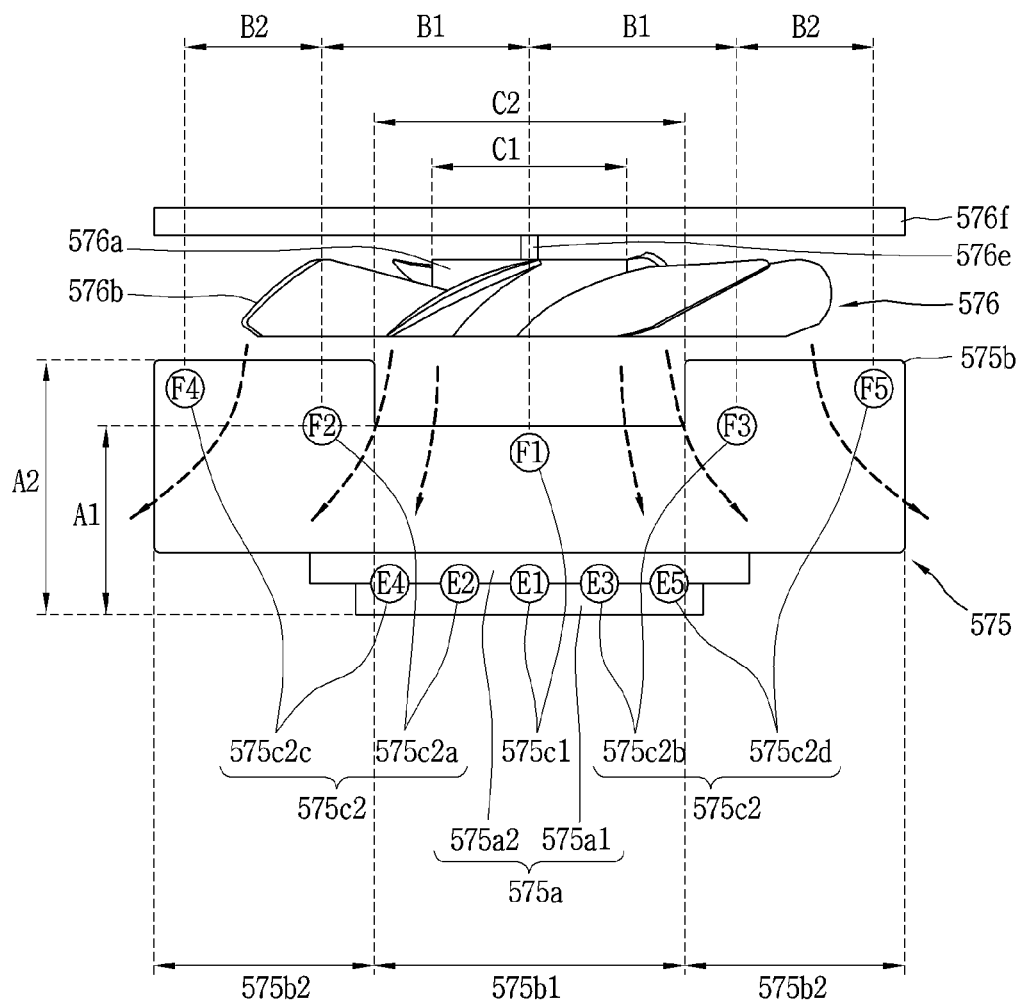
FIG. 8 is a side view of the heat dissipation heat sink and the second axial flow fan shown in FIG. 7.

FIG. 7 is a side view showing a heat dissipation heat sink 575 and a second axial flow fan 576 of a thermoelectric module according to an embodiment of the present disclosure. FIG. 8 is a side view of the heat dissipation heat sink 575 and the second axial flow fan 576 shown in FIG. 7. The second axial flow fan 576 and the heat dissipation heat sink 575 may be spaced apart from each other. For example, there may be a gap of 3 to 4 mm between the second axial flow fan 576 and the heat dissipation heat sink 575 in a direction parallel to a rotary shaft 576*e*.

The heat dissipation heat sink 575 according to the present disclosure may include a base 575*a* (see FIG. 8), fins 575*b*, and heat pipes 575*c*. Each of the elements will be described below. The base 575*a* may be in surface contact with the heat dissipation plate 371*b* (see FIG. 4) of the thermoelectric element 371 (see FIG. 4). Thus, heat may be transferred from the thermoelectric element 371 to the base 575*a*.

The base 575*a* may be formed in two layers 575*a*1 and 575*a*2 to have base passing parts or grooves through which base passing portions E1, E2, E3, E4, and E5 of the heat pipes 575*c* may pass. A first layer 575*a*1 of the base 575*a* may surround a first side of the heat pipes 575*c*, a second layer 575*a*2 of the base 575*a* may surround a second side of the heat pipes 575*c*, and the two layers 575*a*1 and 575*a*2 may face each other. FIG. 7 shows that a heat pipe receiving unit or groove 575*a*2' may be formed in the second layer 575*a*2.

The fins 575*b* may protrude from the base 575*a* toward the second axial flow fan 576 and may be spaced apart from each other. FIG. 7 shows that the fins 575*b* may be arranged separately from each other. FIG. 8 shows that the fins 575*b* may protrude from the base 575*a* toward the second axial flow fan 576. Each of the fins 575*b* may include a first part or section 575*b*1 and a second part or section 575*b*2 that are different in height or depth. Here, the height refers to a distance from the base 575*a* to the second axial flow fan 576.

A distinction between the first section 575*b*1 and the second section 575*b*2 may be set on the basis of the second axial flow fan 576. This is because a dead zone may occur due to the second axial flow fan 576. The first section 575b1 may protrude from the base 575a toward the second axial flow fan 576 and may face a hub 576a.

The second section 575b2 may protrude from the base 575a toward the second axial flow fan 576 and may face vanes 576b. Since the vanes 576b are installed around the hub 576a, the second section 575b2 may be provided at both sides of the first section 575b1.

The second section 575b2 may protrude further from the base 575a than the first section 575b1. Referring to FIG. 8, the second section 575b2 provided behind the vanes 576b may have a greater depth than the first section 575b1 provided behind the hub 576a.

Compared to the heat sink 472 described with reference to FIGS. 5 and 6, a part acting as an air flow resistance may be removed from the back of the hub 576a in the heat dissipation heat sink 575 of FIG. 7 because the first section 575b1 may have a smaller depth than the second section 575b2. Thus, even when the volume and speed of air supplied to the back of the hub 576a are relatively small, the first section 575b1 may participate in the exchange of heat.

However, the dead zone problem of the heat dissipation heat sink 575 cannot be solved only by the first section 575b1 having a smaller depth than the second section 575b2. An area participating in an exchange of heat may decrease and thus thermal conductivity may decrease as the depth of the first section 575b1 decreases. In other words, a flow resistance and a heat exchange area that change with a decrease in depth of the first section 575b1 may be a trade-off relationship.

Accordingly, the depth of the first section 575b1 may be determined such that the depth exchange area is sacrificed as little as possible. When the sum of the depth of the first section 575b1 and the thickness of the base 575a is defined as a first depth Al and the sum of the depth of the second section 575b2 and the thickness of the base 575a is defined as a second depth A2, the first height A1 may be 50 to 70% of the second depth A2.

For example, when the second depth A2 is 25 mm, the first depth A1 may be in the range of 12.5 to 17.5 mm. When the first depth A1 is less than 50% of the second depth A2, the heat exchange area may be excessively sacrificed. On the other hand, when the first depth A1 is greater than 70% of the second depth A2, the first section 575b1 may still act as an air flow resistance.

As described above, in order to secure sufficient cooling capacity of the thermoelectric element 371 (see FIG. 4), the heat dissipation heat sink 575 may have a greater heat exchange area than the heat absorption heat sink 372 (see FIG. 4). Accordingly, the heat of the thermoelectric element may be evenly distributed to the fins 575b of the heat dissipation heat sink 575 to sufficiently utilize a great heat exchange area of the heat dissipation heat sink 575.

The heat pipes 575c may receive heat from the base 575a and distribute the received heat to the fins 575b. For the purpose of heat distribution, each of the heat pipes 575c may have base passing portions E1, E2, E3, E4, and E5 and fin passing parts or portions F1, F2, F3, F4, and F5.

The base passing portions E1, E2, E3, E4, and E5 may correspond to first ends of the heat pipes 575c1, 575c2a, 575c2b, 575c2c, and 575c2d, respectively. The base passing portions E1, E2, E3, E4, and E5 may pass through the base 575a and receive heat from the base 575a. A heat transfer fluid accommodated in the heat pipes 575c may be evaporated by the heat received from the base 575a and may flow toward the fin passing portions F1, F2, F3, F4, and F5.

The fin passing portions F1, F2, F3, F4, and F5 may correspond to the second ends of the heat pipes 575c1, 575c2a, 575c2b, 575c2c, and 575c2d, respectively. The fin passing portions F1, F2, F3, F4, and F5 may pass through the fins 575b and transfer the heat to the fins 575b. The fluid flowing through the heat pipes 575c1, 575c2a, 575c2b, 575c2c, and 575c2d which are accommodated in fin passing portions F1, F2, F3, F4, F5 may transfer the heat to the fins 575b, condense, and then flow back to the base passing portions E1, E2, E3, E4, and E5.

In order to maximize the heat exchange performance of the heat dissipation heat sink 575 including the heat pipes 575c, an arrangement of the heat pipes 575c may be determined according to the volume and speed of air formed by the second axial flow fan 576. The heat exchange area of the fins 575b may be determined by the air flow formed by the second axial flow fan 576. Accordingly, the heat pipes 575c may be provided in high density in a region on which the volume and speed of air are concentrated. Heat may be actively exchanged in the region on which the volume and speed of air are concentrated.

As described above, the volume and speed of air formed by the second axial flow fan 576 may be more concentrated on the first section 575b1 of each of the fins 575b than on the second section 575b2. Accordingly, it may be possible to maximize the heat exchange performance of the heat dissipation heat sink 575 by densely arranging the fin passing portions F1, F2, F3, F4, and F5 of the heat pipes 575c in the second section 575b2.

The heat pipes 575c may be classified into a first group 575c1, which passes through the first section 575b1 of each of the fins 575b, and a second group 575c2, which passes through the second section 575b2 of each of the fins 575b. Since the fin passing portions F1, F2, F3, F4, and F5 pass through the fins 575b, the fin passing portion F1 of the heat pipe 575c1, which belongs to the first group 575c1, may pass through the first section 575b1, and the fin passing portions F2, F3, F4, and F5 of the heat pipes 575c2a, 575c2b, 575c2c, and 575c2d, which belong to the second group 575c2, may pass through the second section 575b2.

In order to maximize the heat exchange performance of the heat dissipation heat sink 575, the number of heat pipes 575c2a, 575c2b, 575c2c, and 575c2d belonging to the second group 575c2 may be greater than the number of heat pipes 575c1 belonging to the first group 575c1. Referring to FIGS. 7 and 8, the number of heat pipes 575c1 passing through the first section 575b1 of each of the fins 575b may be one, and the number of heat pipes 575c2a, 575c2b, 575c2c, 575c2d passing through the second section 575b2 of each of the fins 575b may be four. Accordingly, the number of heat pipes 575c2a, 575c2b, 575c2c, 575c2d belonging to the second group 575c2 may be greater than the number of heat pipes 575c1 belonging to the first group 575c1.

Also, in order to maximize the heat exchange performance of the heat dissipation heat sink 575, a separation distance between the fin passing portions F1, F2, F3, F4, and F5 of the heat pipes 575c may gradually decrease away from the center of each of the fins 575b. Referring to FIG. 8, the fin passing portions F1 of the heat pipe 575c1 belonging to the first group 575c1 may be provided at the center of each of the fins 575b, and the fin passing portions F2, F3, F4, and F5 of the heat pipes 575c2a, 575c2b, 575c2c, and 575c2d belonging to the second group 575c2 may be provided at both sides of the fins 575b and sequentially spaced apart from each other.

In this case, a separation distance between the fin passing portion F1 of the heat pipe 575c1 belonging to the first group 575c1 and the fin passing portions F2 and F3 of the heat pipes 575c2a and 575c2b belonging to the second group 575c2, which are provided at both sides of the first group 575c1, (a separation distance between F1 and F2 and a separation distance between F1 and F3) may be B1, and a separation distance between the fin passing portions F2 and F4 or F3 and F5 of the heat pipes 575c2a, 575c2b, 575c2c, and 575c2db belonging to the second group 575c2 (a separation distance between F2 and F4 and a separation distance between F3 and F5) may be B2. As is seen in the drawings, the separation distance between the fin passing portions F1, F2, F3, F4, and F5 may gradually decrease away from the centers of the fins 575b because B1 is greater than B2. Here, a criterion for the separation distance is a direction normal to a direction of the rotary shaft 576e of the second axial flow fan 576.

Thus, the heat pipes 575c2a, 575c2b, 575c2c, and 575c2d belonging to the second group 575c2 may be arranged at high density. Since the volume and speed of wind are concentrated on the second section 575b2, the heat pipes 575c may be arranged in the second section 575b2 at high density to maximize the heat exchange performance of the heat dissipation heat sink 575.

Since heat pipes 575c may be arranged in the region on which the volume and speed of air flow formed by the second axial flow fan 576 are concentrated at relatively high density, it may be possible to minimize an air flow resistance as well as to enhance the heat exchange performance. Alternatively, when the heat pipes 575c are arranged in the first section 575b1 at high density, a significantly strong flow resistance may be formed in the first section 575b1, and heat may not be sufficiently distributed to the second section 575b2.

The fin passing portion F1 of the heat pipe 575c1 belonging to the first group 575c1 may be provided closer to the base 575a than the fin passing portions F2, F3, F4, and F5 of the heat pipes 575c2a, 575c2b, 575c2c, and 575c2d belonging to the second group 575c2. The possibility of occurrence of a dead zone phenomenon may increase when the first section 575b1 is provided closer to the second axial flow fan 576. Accordingly, the first section 575b1 may also be spaced apart from the second axial flow fan 576.

For the same reason, the fin passing portion F1 of the heat pipe 575c1 belonging to the first group 575c1 may be spaced farther away from the second axial flow fan 576 than the fin passing portions F2, F3, F4, and F5 of the heat pipes 575c2a, 575c2b, 575c2c, and 575c2d belonging to the second group 575c2. This means that the fin passing portion F1 of the heat pipe 575c1 belonging to the first group 575c1 may be provided relatively close to the base 575a.

Since the fin passing portion F1 of the heat pipe 575c1 belonging to the first group 575c1 is provided relatively close to the base 575a, an exchange of heat in the first section 575b1 may primarily take place at a position close to the base 575a. Accordingly, it may be possible to maintain the depth of the first section 575b1 to be lower than the depth of the second section 575b2 without sacrificing thermal conductivity and also prevent a dead zone phenomenon from occurring behind the hub. Due to the above structure, the heat exchange area of the heat dissipation heat sink 575 may be somewhat reduced, but an area of fins 575b that actually participate in the exchange of heat may be rather increased by efficiently using the volume and speed of uneven air flow formed by the second axial flow fan 576.

A distance C2 between the second section 572b2 (for example, at the left side in FIG. 7) provided at a first side of the first section 575b1 and the second section 572b2 (for example, at the right side in FIG. 7) provided at a second side of the first section 575b1 may be greater than a diameter of the hub 576a. For example, when the diameter C1 of the hub 576a is 30 mm, the distance C2 between the second sections 575b2 positioned at both sides of the first section 572b1 may be 30 mm. When the distance C2 between the second sections 575b2 positioned at both sides of the first section 572b1 is less than the diameter C1 of the hub 576a, the second sections 575b2 may act as a resistance to air flow which is to be supplied to the first section 575b1.

Also, when the distance C2 between the second sections 575b2 positioned at both sides of the first section 572b1 is greater than the diameter C1 of the hub 576a, the air to be supplied to the first section 575b1 may be guided between the second sections 575b2 positioned at both sides of the first section 572b1 and used to exchange heat with the first section 575b1. Typically, the guiding of air is the role of a shroud, but the role of the shroud may be replaced with the second sections 575b2 positioned at both sides of the first section 572b1. Thus, the shroud may be an optional element.

The rotary shaft of the second axial flow fan 576 may be connected not to the heat dissipation heat sink 575 but to a heat dissipation cover 576f facing the heat dissipation heat sink 575. Accordingly, the heat dissipation cover 576f may be disconnected from the thermoelectric module, the second axial flow fan 576 may be disconnected together with the heat dissipation cover, and thus the second axial flow fan 576 and the heat dissipation heat sink 575 may be exposed. Since the second section 575b2 may replace the role of the shroud, it may be possible to expose and easily clean the second axial flow fan 576 and the heat dissipation heat sink 575 only by disconnecting the heat dissipation cover 576f.

When an air flow path is blocked by dust caught between the fins of the heat dissipation heat sink 575, this may cause a performance degradation of the heat dissipation heat sink 575. This is because a heat-exchange promoting action induced by air may be hindered from being performed. Also, dust accumulated in the vanes of the second axial flow fan 576 may cause a decrease of the number of rotations per unit time of the hub. Accordingly, in order to maintain the performance of the thermoelectric module, it may be essential to clean the heat dissipation heat sink 575 and the second axial flow fan 576 first.

However, when the second axial flow fan 576 includes a shroud or when the second axial flow fan 576 is connected to the heat dissipation heat sink 575, the thermoelectric module may need to be disassembled to be cleaned. The second axial flow fan 576 may need to be disconnected from the shroud because the second axial flow fan 576 is surrounded by the shroud, and the second axial flow fan 576 may need to be disconnected from the heat dissipation heat sink 575 because the second axial flow fan 576 is connected to the heat dissipation heat sink 575.

According to the present disclosure, however, when the rotary shaft of the second axial flow fan 576 is connected to the heat dissipation cover 576f and the second section 575b2 replaces the role of the shroud, it may be possible to expose the second axial flow fan 576 and the heat dissipation heat sink 575 only by disconnecting the heat dissipation cover 576f, and also make the second axial flow fan 576 and the heat dissipation heat sink 575 available to be cleaned. Accordingly, it may be possible to easily clean the heat dissipation heat sink 575 and the second axial flow fan 576 without needing to disassemble the thermoelectric module.

Compared to the heat sink 472 (see FIGS. 5 and 6), which has only fins with a uniform height, the heat dissipation heat sink 575 according to the present disclosure may improve the performance of the heat dissipation by solving a dead zone problem even if the heat exchange area is slightly sacrificed. When the two heat sinks 472 and 575 are individually applied to the refrigerator 100 (see FIG. 1) or 200 (see FIG. 2), it has been experimentally confirmed that the heat dissipation heat sink 575 of FIG. 7 may maintain the storage chamber 120 (see FIG. 1) or 220 (see FIG. 2) at a lower temperature level than the heat sink 472 under the same experimental conditions.

Figure 9:
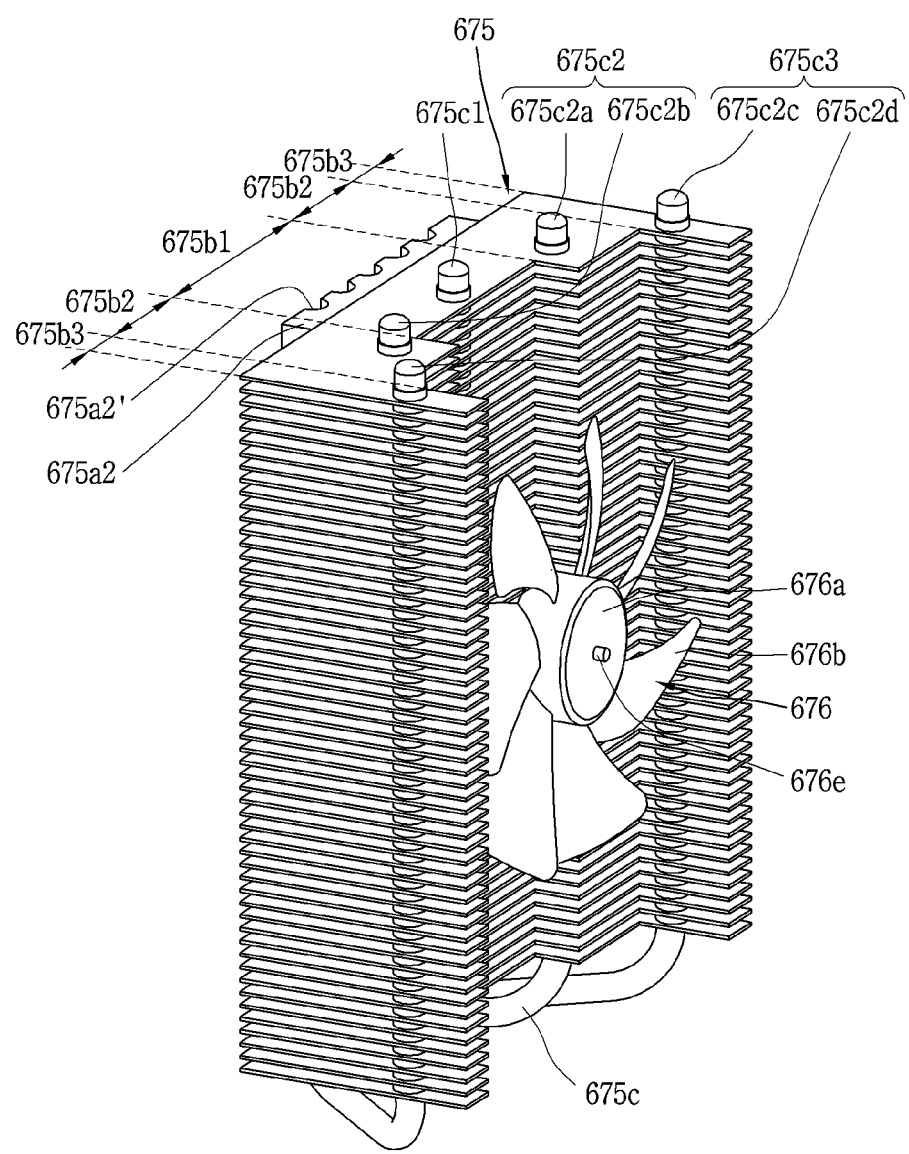
FIG. 9 is a perspective view showing a heat dissipation heat sink and a second axial flow fan of a thermoelectric module according to another embodiment of the present disclosure.
Figure 10:
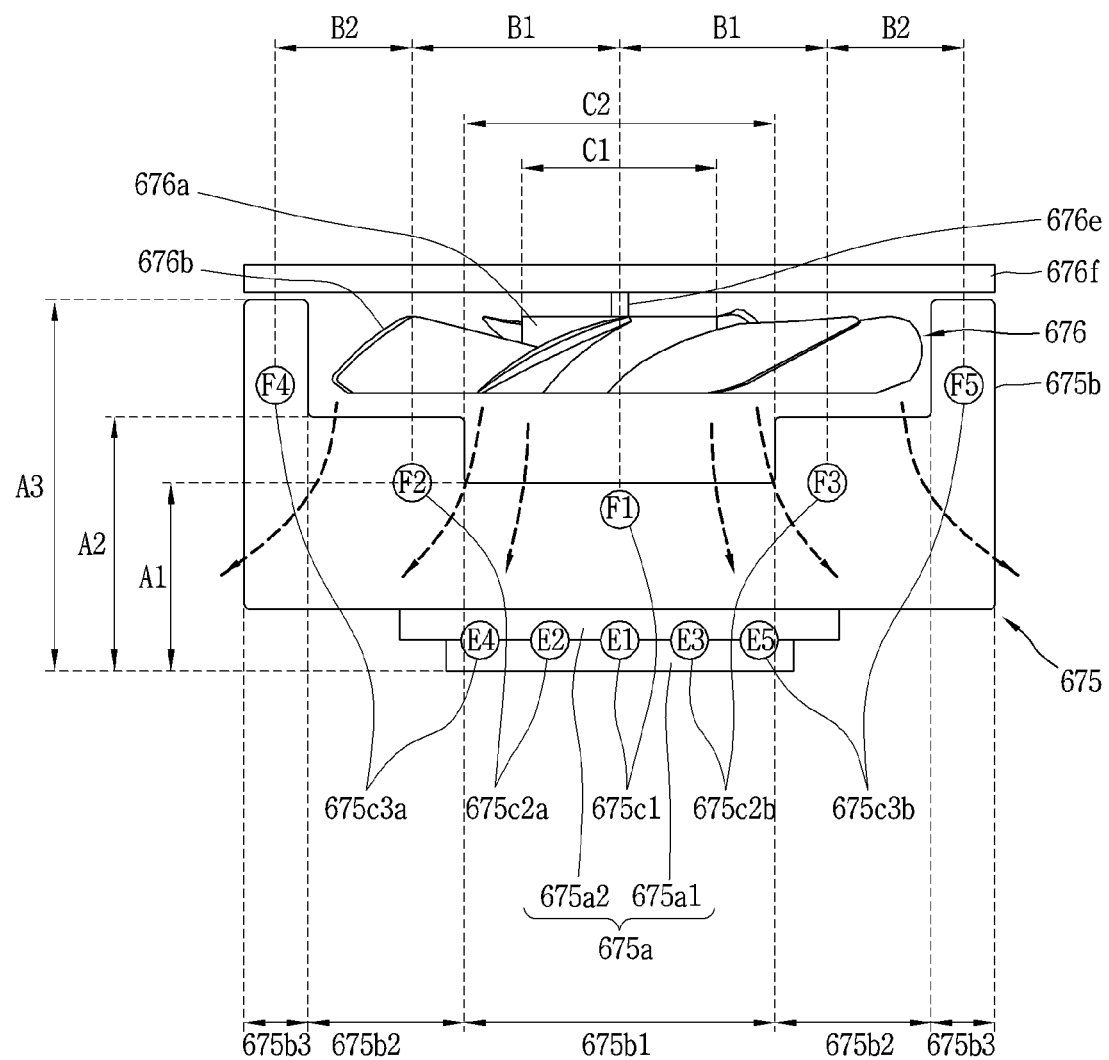
FIG. 10 is a side view of the heat dissipation heat sink and the second axial flow fan shown in FIG. 9.

FIG. 9 is a prospective view showing a heat dissipation heat sink 675 and a second axial flow fan 676 of a thermoelectric module according to an embodiment of the present disclosure. FIG. 10 is a side view of the heat dissipation heat sink 675 and the second axial flow fan 676 shown in FIG. 9. Similarly to that described with reference to FIG. 7, the second axial flow fan 676 may include a hub 676a and vanes 676b. Accordingly, a description of the second axial flow fan 676 may be understood with reference to the descriptions of FIGS. 7 and 8.

Also, similarly to that described with reference to FIGS. 7 and 8, the heat dissipation heat sink 675 may include a first part or section 675b1 and a second part or section 675b2. Accordingly, descriptions of the first section 675b1 and the second section 675b2 may be understood with reference to the descriptions of FIGS. 7 and 8.

Fins 675b of the heat dissipation heat sink 675, which are shown in FIGS. 9 and 10, may further include a third part or section 675b3. Third sections 675b3 may be provided at both sides of a second section 675b2. Referring to FIG. 10, second sections 675b2 may be provided at both sides of the first section 675b1 and third sections 675b3 may be provided at both sides of the second section 675b2.

The third section 675b3 may protrude further from the base 675a than the second section 675b2. Referring to FIG. 10, with respect to the base 675a, the first section 675b1 may be shortest, the second section 675b2 may be longer than the first section 675b1 and shorter than the third section 675b3, and the third section 675b3 may be longer than both the first section 675b1 and the second section 675b2.

The third section 675b3 may be spaced apart from the vanes 676b and may surround the vanes 676b. As each of the fins 675b of the heat dissipation heat sink 675 may include a first section 675b1, a second section 675b2, and a third section 675b3, the fins 675b may have a nest shape, and the second axial flow fan 676 may be provided inside the nest shape. As the third section 675b3 may surround the vanes 676b, the air flow formed by the second axial flow fan 676 may be guided toward the fins 675b of the heat dissipation heat sink 675.

As described above, the guiding of air flow is typically the role of a shroud. However, since the third section 675b3 may surround the vanes 676b, the third section 675b3 may guide the air flow without the shroud. In particular, the third section 675b3 may entirely guide the air while the second section 675b2 may partially guide the air. Accordingly, when the heat dissipation heat sink 675 including the third section 675b2 is included in the thermoelectric module, the shroud for the second axial flow fan 676 may be an optional element.

As described above, when the thermoelectric module does not have the shroud and the rotary shaft is connected to the heat dissipation cover 676f, it may be possible to facilitate cleaning of the thermoelectric module. Heat pipes 675c may be classified into a first group 675c1, which passes through the first section 675b1 of each of the fins 675b, a second group 675c2, which passes through the second section 675b2 of each of the fins 675b, and a third group 675c3, which passes through the third section 675b3 of each of the fins 675b.

In order to maximize the heat exchange performance of the heat dissipation heat sink 675, the number of heat pipes 675c2a, 675c2b, 675c3a, and 675c3b belonging to the second group 675c2 and the third group 675c3 may be greater than the number of heat pipes 675c1 belonging to the first group 675c1. Referring to FIGS. 9 and 10, the number of heat pipes 675c1 passing through the first section 675b1 of each of the fins 575b may be one, the number of heat pipes 675c2a and 675c2b passing through the second section 675b2 of each of the fins 675b may be two, and the number of heat pipes 675c3a and 675c3b passing through the third section 675b3 of each of the fins 675b may be two. Accordingly, the number of heat pipes 675c2a, 675c2b, 675c3a, and 675c3b belonging to the second group 675c2 and the third group 675c3 is greater than the number of heat pipes 675c1 belonging to the first group 675c1.

A separation distance between the fin passing portions F1, F2, F3, F4, and F5 of the heat pipes 675c may gradually decrease away from the centers of the fins 675b. Referring to FIG. 10, the fin passing portion F1 of the heat pipe 675c1 belonging to the first group 675c1 may be provided at the center of each of the fins 575b, and the fin passing portions F2 and F3 of the heat pipes 675c2a and 675c2b belonging to the second group 675c2 and the fin passing portions F4 and F5 of the heat pipes 675c3a and 675c3b belonging to the third group 675c3 may be sequentially provided at both sides of the fins 575b and separated apart from each other.

In this case, a separation distance between the fin passing portion F1 of the heat pipe 675c1 belonging to the first group 675c1 and the fin passing portions F2 and F3 of the heat pipes 675c2a and 675c2b belonging to the second group 675c2 (a separation distance between F1 and F2 and a separation distance between F1 and F3) is B1, and a separation distance between the fin passing portions F2 and F3 of the heat pipes 675c2a and 675c2b belonging to the second group 675c2 and the fin passing portions F4 and F5 of the heat pipes 675c3a and 675c3b belonging to the third group 675c3 (a separation distance between F2 and F4 and a separation distance between F3 and F5) is B2. As can be seen from the drawings, the separation distance between the fin passing portions F1, F2, F3, F4, and F5 may gradually decrease away from the centers of the fins 575b because B1 is greater than B2. Here, a criterion for the separation distance may be a direction normal to a direction of the rotary shaft 676e of the second axial flow fan 676.

Thus, the heat pipes 675c2a and 675c2b belonging to the second group 675c2 and the heat pipes 675c3a and 675c3b belonging to the third group 675c3 may be arranged at a higher density than the heat pipe 675c1 belonging to the first group 675c1. Since the volume and speed of air are concentrated on the second section 675b2 and the third section 675b3, the heat pipes 675c may be arranged in the second section 675b2 and the third section 675b3 at high density to maximize the heat exchange performance of the heat dissipation heat sink 675.

The fin passing portions F2 and F3 of the heat pipes 675c2a and 675c2b belonging to the second group 675c2 may be provided further away from the base 675a than the fin passing portion F1 of the heat pipe 675c1 belonging to the first group 675c1 and may be provided closer to the base 675a than the fin passing portions F4 and F5 of the heat pipes 675c3a and 675c3b belonging to the third group 675c3. This can be seen from a comparison of A1<A2<A3.

Here, A1 is defined to be the sum of the depth of the first section 675b1 and the thickness of the base 675a, A2 is defined to be the sum of the depth of the second section 675b2 and the thickness of the base 675a, and A3 is defined to be the sum of the depth of the third section 675b3 and the thickness of the base 675a. Since the heat pipe 675c1 belonging to the first group 675c1 may be provided relatively close to the base 675a, an exchange of heat in the first section 675b1 may be intensively made at a position close to the base 675a. Accordingly, it may be possible to maintain the depth of the first section 675b1 lower than the depth of the second section 675b2 and also prevent a dead zone phenomenon from occurring behind the hub 676a.

Also, the arrangement of the heat pipes 675c may be associated with characteristics of the second axial flow fan 676. The second axial flow fan 676 may generate an air flow in a direction of the rotary shaft 676e. In this case, the air may blow not in a direction parallel to the direction of the rotary shaft 676e but in the direction of the rotary shaft 676e and then in a direction away from the rotary shaft 676e. Accordingly, the volume of air may be more concentrated on the second section 675b2 and the third section 675b3 than on the first section 675b1, and the speed of air blowing from the second section 675b2 and the third section 675b3 may be greater than the speed of air blowing from the first section 675b1.

Even when the third section 675b3 surrounds the vanes 676b because of characteristics of the second axial flow fan 676, the air flow formed by the second axial flow fan 676 may be supplied to the third section 675b3. Also, since the fin passing portions F4 and F5 of the heat pipes 675c3a and 675c3b belonging to the third group 675c3 are relatively spaced apart from the base 675a, the heat pipes 675c3a and 675c3b may transfer heat up to the third section 675b3 and cause the third section 675b3 to exchange heat.

As described above, the heat dissipation heat sink 675 according to the present disclosure may maximally utilize an available heat exchange area by using characteristics in which the volume and speed of air flow formed by the second axial flow fan 676 are different for each region. Thus, it may be possible to solve the dead zone problem and switch a shroud to an optional element and also to maintain the storage chamber 120 (see FIG. 1) or 220 (see FIG. 2) at lower temperature under the same conditions and facilitate cleaning of the elements inside the storage chamber 120.

Figure 11:
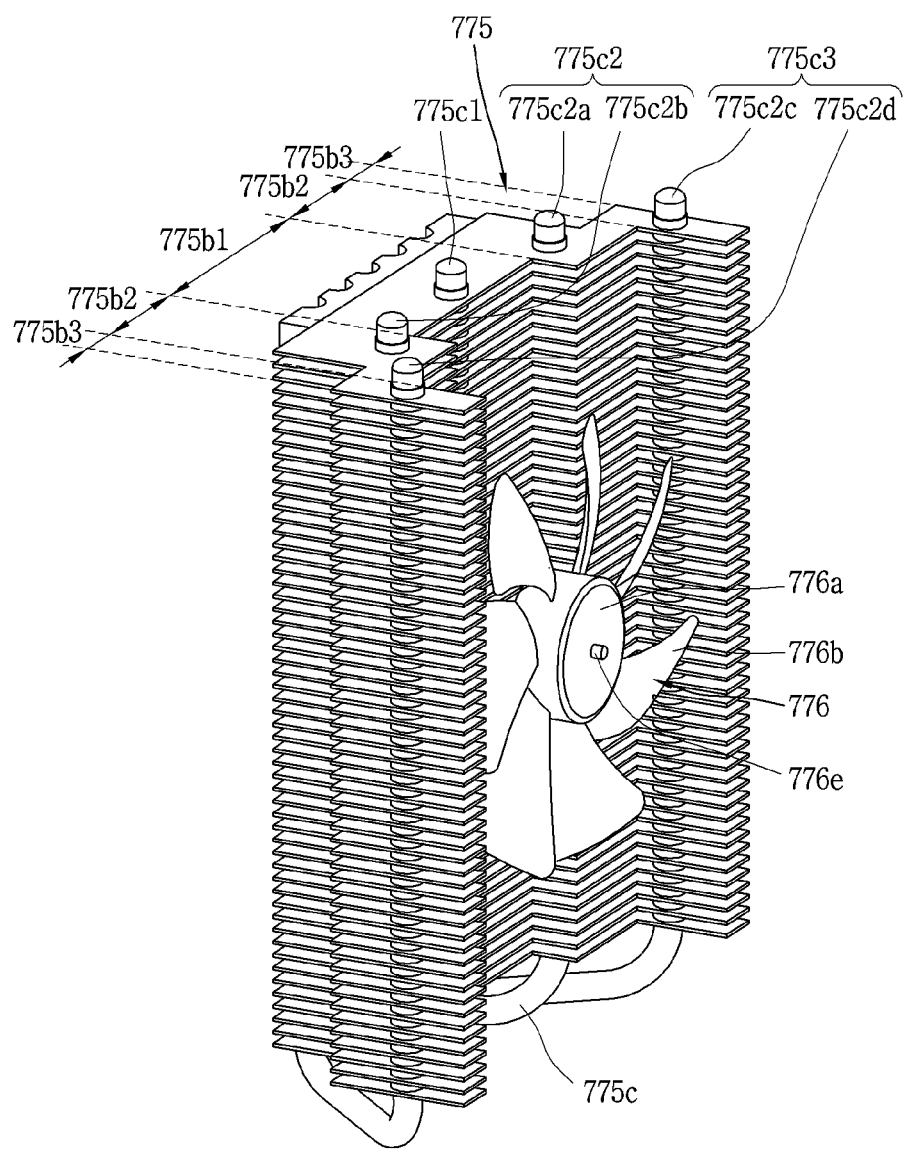
FIG. 11 is a perspective view showing a heat dissipation heat sink and a second axial flow fan of a thermoelectric module according to still another embodiment of the present disclosure.
Figure 12:
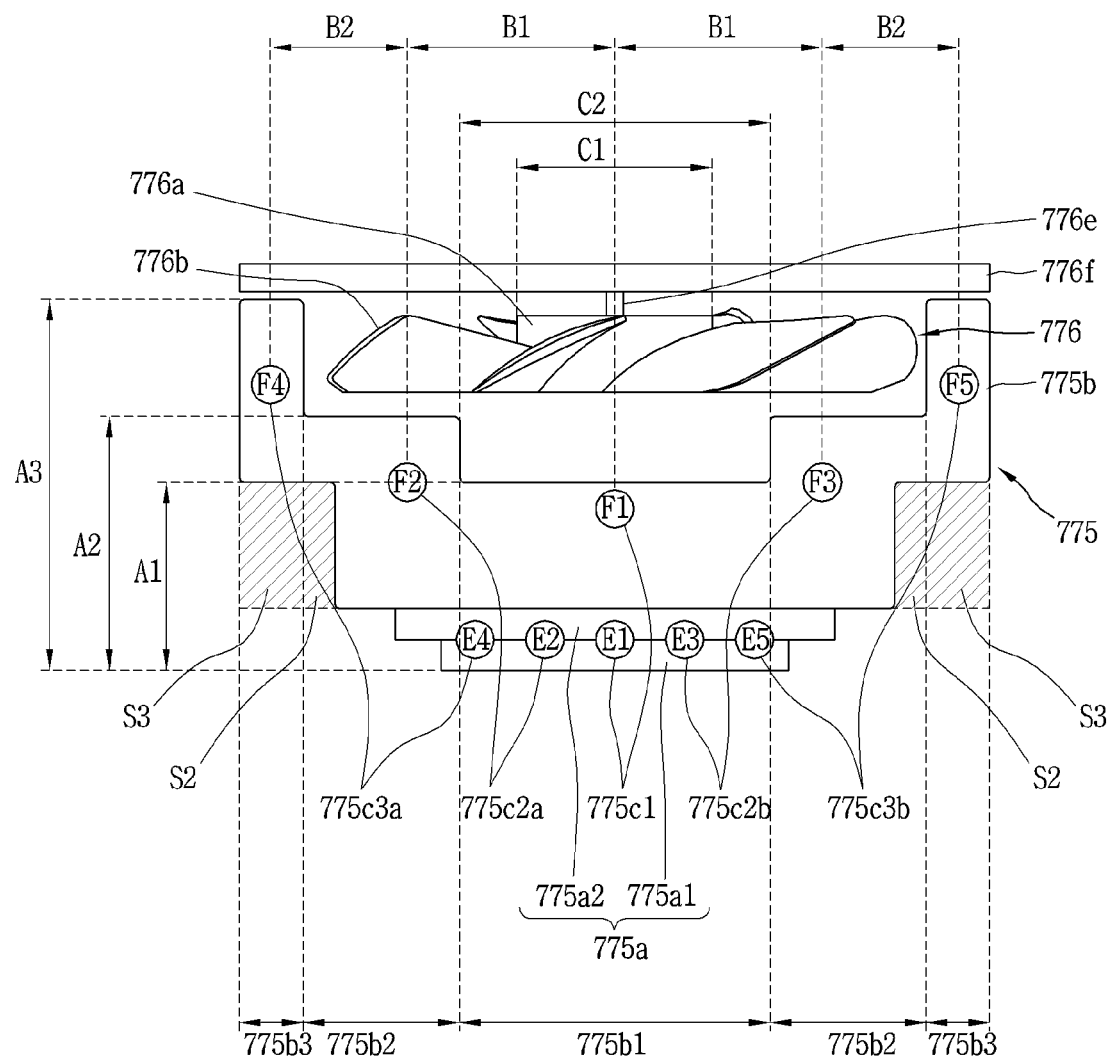
FIG. 12 is a side view of the heat dissipation heat sink and the second axial flow fan shown in FIG. 11.

FIG. 11 is a prospective view showing a heat dissipation heat sink 775 and a second axial flow fan 776 of a thermoelectric module according to still another embodiment. FIG. 12 is a side view of the heat dissipation heat sink 775 and the second axial flow fan 776 shown in FIG. 11. The heat dissipation heat sink 775 shown in FIGS. 11 and 12 may be substantially the same as the heat dissipation heat sink 675 shown in FIGS. 9 and 10. However, the heat dissipation heat sink 775 shown in FIGS. 11 and 12 may have a smaller heat transfer area by the regions corresponding to S2 and S3 than the heat dissipation heat sink 775 shown in FIGS. 9 and 10.

The second section 775b2 may not have the region S2. The second section 775b2 may protrude from the base 775a toward the second axial flow fan 776 and protrude in a direction away from the first section 775b1. Accordingly, the second part 775b2 may have the shape of "¬."

The third section 775b3 may not have the region S3. The third section 775b3 may protrude not from the base 775a but from both sides of the second section 775b2 up to a position surrounding the vanes 776b of the second axial flow fan 776.

S2 may correspond to some region of the second section 775b2, and S3 may correspond to some region of the third section 775b3. Since the regions corresponding to S2 and S3 are relatively spaced apart from the second axial flow fan 776 and heat pipes 775c, the regions S2 and S3 may be regions where it is difficult to sufficiently exchange heat.

Accordingly, when the second section 775b2 of the fins 775b does not have the region S2 and the third section 775b3 does not have the region S3, the regions may be utilized to arrange other elements. For example, the joint plate 378 (see FIG. 4) described with reference to FIG. 4 may be provided in the region S2 and the region S3. Examples of the elements may be changed depending on designs of the thermoelectric module or refrigerator. Since the regions S2 and S3 are regions that do not sufficiently participate in the exchange of heat, the deterioration of heat exchange performance may be limited even when the second section 775b2 does not have the region S2 and the third section 775b3 does not have the region S3.

Alternatively, the second section 775b2 may have the region S2, and only the third section 775b3 may not have the region S3. In this case, the second section 775b2 may protrude from the base 775a toward the vanes 776b of the second axial flow fan 776 and have a quadrangular shape.

The other elements have been described above, and thus the descriptions thereof will be omitted. The thermoelectric module and the refrigerator having the same that have been described above are not limited to the configurations and methods of the above-described embodiments, and various modifications to the embodiments may be made by selectively combining all or some of the embodiments.

According to the present disclosure, it may be possible to solve a dead zone problem that occurs behind a hub and thus improve cooling performance of a thermoelectric module. A dead zone may refer to a region of a heat sink where heat is not sufficiently exchanged. Typically, the dead zone may occur behind a hub due to 1) a flow resistance formed by fins of a heat sink and 2) an uneven air volume distribution of a fan. The thermoelectric module of the heat sink of the present disclosure may include fins protruding from a base toward an axial flow fan, and each of the fins may include a first section and a second section that have different protrusion lengths.

Also, the first section, which may face the hub of the axial flow fan, may have a shorter protrusion length than the second section, which may face the vanes of the axial flow fan. The first section, which may form a flow resistance behind the hub, having a shorter protrusion length than the second section may denote that a region length that has formed the flow resistance is shortened. Accordingly, it may be possible to alleviate a flow resistance. When a dead zone occurs behind a hub, it may be difficult to use fins of a region located in the dead zone to exchange heat. However, when a dead zone problem is solved by the present disclosure, the first section positioned behind the hub may also be used to exchange heat.

Also, the present disclosure may partially guide the volume of air flow formed by the axial flow fan toward the first section because the second part may have a greater protrusion length than the first section. Typically, the guiding of the volume of air flow formed by the axial flow fan is the role of a shroud. However, the second section may replace the role of the shroud, and thus it may be possible to simplify the configuration of the thermoelectric module. Furthermore, since the third section may protrude further from the base than the first section and the second section may surround the vanes of the axial flow fan, it may be possible to sufficiently supply the volume of air flow of the axial flow fan to the heat sink even when a shroud is not installed in the axial flow fan.

Also, the present disclosure may provide a structure that places fin passing holes of heat pipes in consideration of characteristics of the axial flow fan. It may be possible to quickly distribute heat from a base to fins and thus maximize heat exchange performance of the heat sink by densely placing the fin passing holes in a region on which the volume and speed of air are concentrated. Also, it may be possible to alleviate an air flow resistance by lowering a density at which the fin passing holes are placed in a region where the volume and speed of air are not sufficient.

Also, a rotary shaft of the second axial flow fan may be connected not to the heat sink but to the heat dissipation cover. Accordingly, it may be possible to expose the second axial flow fan and the heat dissipation heat sink to the outside so that they can be cleaned just by disconnecting the heat dissipation cover from the thermoelectric module. Also, it may be possible to guide air flow through a structure in which the fins of the heat dissipation heat sink are formed to surround the second axial flow fan and switch a shroud that should have guided the wind into an optional element. Thus, it may be possible to solve an inconvenience caused by disassembling a shroud to be cleaned.

A thermoelectric module may include a thermoelectric element; a heat sink provided in contact with the thermoelectric element and configured to exchange heat with a region from which heat is to be absorbed or a region from which heat is to be dissipated; and an axial flow fan installed to face the heat sink and configured to generate an air flow to facilitate the exchange of heat performed by the heat sink.

The axial flow fan may have a hub coupled to a rotary shaft and vanes installed around the hub. The heat sink may include a base configured to come in surface contact with the thermoelectric element; fins protruding from the base toward the axial flow fan and spaced apart from each other; and heat pipes having base passing portions passing through the base and fin passing portions passing through the fins and configured to transfer heat from the base to the fins. Each of the fins may include a first section protruding from the base toward the second axial flow fan and facing the hub; and a second section provided at both sides of the first section to face the vanes and protruding further from the base toward the second axial flow fan than the first section.

The thermoelectric element may have a heat absorption plate (a heat absorption surface, a first part, and a first surface) and a heat dissipation plate (a heat dissipation surface, a second part, and a second surface) that are oriented in opposite directions.

The thermoelectric module may include a plurality of heat sinks and a plurality of axial flow fans. A first heat sink may be provided to be in contact with the heat absorption plate of the thermoelectric module and configured to exchange heat with a region from which heat is to be absorbed. A second heat sink may be provided to be in contact with the heat dissipation plate of the thermoelectric module and configured to exchange heat with a region from which heat is to be dissipated. A first axial flow fan may be installed to face a heat absorption heat sink and configured to generate air flow to facilitate the exchange of heat performed by the heat absorption heat sink. A second axial flow fan may be installed to face a heat dissipation heat sink and configured to generate air flow to facilitate the exchange of heat performed by the heat dissipation heat sink.

The thermoelectric module may include a heat insulating material. The heat insulating material may surround a border of the thermoelectric element and may be installed between the heat absorption heat sink and the heat dissipation heat sink.

The thermoelectric module may further include a joint plate. The joint plate may surround a border of the thermoelectric element together with the heat insulating material and may be provided between the heat absorption heat sink and the heat insulating material or between the heat dissipation heat sink and the heat insulating material. The heat absorption heat sink and the heat dissipation heat sink may be fastened to the joint plate.

The heat pipes may include a first group passing through the first section of each of the fins and a second group passing through the second section of each of the fins, and the number of heat pipes belonging to the second group may be greater than the number of heat pipes belonging to the first group. A separation distance between the fin passing portions of the heat pipes may gradually decrease away from a center of each of the fins with respect to a direction normal to a direction of the rotary shaft of the second axial flow.

The heat pipes may include a first group passing through the first section of each of the fins and a second group passing through the second section of each of the fins, and fin passing portions of the heat pipes belonging to the first group may be arranged closer to the base than fin passing holes of the heat pipes belonging to the second group. A distance between a second section provided at a first side of the first section and a second section provided at a second side of the first section may be greater than a diameter of the hub.

Each of the fins may be provided at both sides of the second section and may further include a third section protruding further from the base than the second section. The third section may be spaced apart from the vanes to surround the vanes. The heat pipes may include a first group passing through the first section of each of the fins, a second group passing through the second section of each of the fins, and a third group passing through the third section of each of the fins, and the number of heat pipes belonging to the second group and the number of heat pipes belonging to the third group may be greater than the number of heat pipes belonging to the first group.

A separation distance between the fin passing holes of the heat pipes may gradually decrease away from a center of each of the fins with respect to a direction normal to a direction of the rotary shaft of the second axial flow. The heat pipes may include a first group passing through the first section 0 of each of the fins, a second group passing through the second section of each of the fins, and a third group passing through the third section of each of the fins, and fin passing holes of the heat pipes belonging to the second group may be arranged further away from the base than fin passing holes of the heat pipes belonging to the first group and may be arranged closer to the base than fin passing holes of the heat pipes belonging to the third group. The volume and speed of air formed by the second axial flow fan may be greater than the volume and speed of air formed by the first axial flow fan, and the heat dissipation heat sink may have a wider heat exchange area than the heat absorption heat sink by a factor of three or more.

The thermoelectric module may further include a joint plate formed to surround a border of the thermoelectric element together with the heat insulating material. The joint plate may be arranged between the heat absorption heat sink and the heat insulating material or between the heat dissipation heat sink and the heat insulating material, and the heat absorption heat sink and the heat dissipation heat sink may be fastened to the joint plate.

The thermoelectric module may include a heat dissipation cover provided opposite to the heat dissipation heat sink. The rotary shaft of the second axial flow fan may be connected to the heat dissipation cover such that the second axial flow fan is spaced away from the heat dissipation heat sink when the heat dissipation cover is disconnected from the thermoelectric module.

A refrigerator may include the thermoelectric module. The refrigerator may include a cabinet, a door, a drawer, and the thermoelectric module.

The cabinet may have an inner case forming a storage chamber of 200 L or less, an outer case forming an outer appearance of the refrigerator, and a heat insulating material provided between the inner case and the outer case. The door may be installed at the front of the cabinet and may open or close the storage chamber through a sliding movement. The drawer may be provided inside the storage chamber to form a food storage region and may be coupled to the door and drawn from the storage chamber through the sliding movement of the door. The thermoelectric module may have a thermoelectric element, an axial flow fan, and a heat sink and may be installed at a rear wall of the storage chamber to cool the storage chamber.

The drawer may include a first drawer and a second drawer provided above the first drawer, and the thermoelectric module may be installed higher than a gap between the first drawer and the second drawer. Alternatively, the thermoelectric module may be installed to face the second drawer.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thermoelectric module comprising:
a thermoelectric element having a heat absorption surface facing a first direction and a heat dissipation surface facing a second direction different from the first direction;
a heat absorption heat sink provided in contact with the heat absorption surface and configured to absorb heat from a first region;
a first axial flow fan installed to face the heat absorption heat sink and configured to generate a first air flow to facilitate an exchange of heat performed by the heat absorption heat sink;
a heat dissipation heat sink provided in contact with the heat dissipation surface and configured to dissipate heat to a second region;
a second axial flow fan installed to face the heat dissipation heat sink and configured to generate a second air flow to facilitate an exchange of heat performed by the heat dissipation heat sink; and
an insulator surrounding the thermoelectric element and installed between the heat absorption heat sink and the heat dissipation heat sink, wherein the second axial flow fan has a hub coupled to a rotary shaft and vanes installed around the hub, and the heat dissipation heat sink includes:
a base configured to contact the heat dissipation surface;
fins protruding from the base toward the second axial flow fan and spaced apart from each other; and
heat pipes having base passing portions passing through the base and fin passing portions passing through the fins and configured to transfer heat from the base to the fins;
wherein each of the fins includes:
a first section protruding from the base toward the second axial flow fan and facing the hub; and
at least one second section provided at each side of the first section to face the vanes and protruding further from the base toward the second axial flow fan than the first section,
wherein the at least one second section comprises a first second section provided at a first side of the first section and a second second section provided at a second side of the first section, and wherein a distance between the first second section and the second second section is greater than a diameter of the hub; and
wherein each of the fins further includes a third section, wherein the third section comprises a first third section provided at a lateral side of the first second section and a second third section provided at a lateral side of the second second section, and wherein the first and second third sections protrude further from the base than the first and second second sections, and are spaced apart from the vanes to partially surround the vanes.

2. The thermoelectric module of claim 1, wherein the heat pipes include:
a first group passing through the first section of each of the fins; and
a second group passing through the at least one second section of each of the fins, wherein
the number of heat pipes belonging to the second group is greater than the number of heat pipes belonging to the first group, and the fin passing portions of the heat pipes belonging to the first group are arranged closer to the base than the fin passing portions of the heat pipes belonging to the second group.

3. The thermoelectric module of claim 1, wherein a separation distance between the fin passing portions of the heat pipes of the at least one second section is longer than a separation distance between a fin passing portion of a heat pipe of the first section and a fin passing portion of a heat pipe of the at least one second section with respect to a direction perpendicular to an axial direction of the second axial flow fan.

4. The thermoelectric module of claim 1, wherein the heat pipes include:
a first group passing through the first section of each of the fins;
a second group passing through the first and second sections of each of the fins; and
a third group passing through the first and second third sections of each of the fins, wherein the number of heat pipes belonging to the second group and the number of heat pipes belonging to the third group are greater than the number of heat pipes belonging to the first group, and the fin passing portions of the heat pipes belonging to the second group are arranged further away from the base than the fin passing portions of the heat pipes belonging to the first group and are arranged closer to the base than the fin passing portions of the heat pipes belonging to the third group.

5. The thermoelectric module of claim 4, wherein a separation distance between the fin passing portions of the first section and the first second section is greater than a separation distance between the fin passing portions of the first second section and the first third section with respect to a direction perpendicular to an axial direction of the second axial flow fan.

6. The thermoelectric module of claim 1, wherein the heat dissipation heat sink has a greater heat exchange area than the heat absorption heat sink by a factor of three or more.

7. The thermoelectric module of claim 1, further including:
a joint plate that surrounds a border of the thermoelectric element together with the insulator; and
a heat dissipation cover provided opposite to the heat dissipation heat sink, wherein the joint plate is provided between the heat absorption heat sink and the insulator or between the heat dissipation heat sink and the insulator, the heat absorption heat sink and the heat dissipation heat sink are fastened to the joint plate, and the rotary shaft of the second axial flow fan is connected to the heat dissipation cover such that the second axial flow fan is spaced away from the heat dissipation heat sink when the heat dissipation cover is disconnected from the thermoelectric module.

8. A refrigerator comprising:
a cabinet having an inner case forming a storage chamber, an outer case forming an external appearance of the refrigerator, and an insulation provided between the inner case and the outer case;
a door installed at a front of the cabinet and configured to open or close the storage chamber through a sliding movement;
at least one drawer provided inside the storage chamber and coupled to the door to form a food storage region, wherein the at least one drawer is drawn from the storage chamber through the sliding movement of the door; and
a thermoelectric module including a thermoelectric element, at least one axial flow fan, and at least one heat sink, and the thermoelectric module is installed at a rear wall of the storage chamber to cool the storage chamber, wherein the at least one axial flow fan includes a hub coupled to a rotary shaft and vanes installed around the hub, and wherein the at least one heat sink includes:
a base configured to contact a heat dissipation surface of the thermoelectric element;
fins protruding from the base toward the at least one axial flow fan and spaced apart from each other; and
heat pipes having base passing portions passing through the base and fin passing portions passing through the fins and configured to transfer heat from the base to the fins;
wherein each of the fins includes:
a first section protruding from the base toward the at least one axial flow fan and arranged to face the hub; and
at least one second section provided at each side of the first section to face the vanes and protruding further from the base toward the at least one axial flow fan than the first section,
wherein the at least one heat sink includes a heat absorption heat sink and a heat dissipation heat sink, the at least one axial flow fan includes a first axial flow fan and a second axial flow fan, and the thermoelectric module includes:
the thermoelectric element having the heat dissipation surface facing a first direction and a heat absorption surface facing a second direction opposite the first direction;
the heat absorption heat sink provided in contact with the heat absorption surface and configured to absorb heat from a first region;
the first axial flow fan facing the heat absorption heat sink and configured to generate a first air flow to facilitate an exchange of heat performed by the heat absorption heat sink;
the heat dissipation heat sink provided in contact with the heat dissipation surface and configured to dissipate heat to a second region;
the second axial flow fan facing the heat dissipation heat sink and configured to generate a second air flow to facilitate an exchange of heat performed by the heat dissipation heat sink; and
an insulator surrounding the thermoelectric element and installed between the heat absorption heat sink and the heat dissipation heat sink;
wherein the at least one second section comprises a first second section provided at a first side of the first section and a second second section provided at a second side of the first section, and wherein a distance between the first second section and the second second section is greater than a diameter of the hub; and
wherein each of the fins further includes a third section, wherein the third section comprises a first third section provided at a lateral side of the first second section and a second third section provided at a lateral side of the second second section, and wherein the first and second third sections protrude further from the base than the first and second second sections and are spaced apart from the vanes to partially surround the vanes.

9. The refrigerator of claim 8, wherein the storage chamber is 200 L or less in size, the at least one drawer includes a first drawer and a second drawer provided above the first drawer, and the thermoelectric module is installed higher than a gap between the first drawer and the second drawer and faces the second drawer.

10. The refrigerator of claim 8, wherein the heat pipes include:
a first group passing through the first section of each of the fins; and a second group passing through the at least one second section of each of the fins, wherein the number of heat pipes belonging to the second group is greater than the number of heat pipes belonging to the first group, and the fin passing portions of the heat pipes belonging to the first group are arranged closer to the base than the fin passing portions of the heat pipes belonging to the second group.

11. The refrigerator of claim 8, wherein a separation distance between the fin passing portions of the heat pipes of the at least one second section is longer than a separation distance between a fin passing portion of a heat pipe of the first section and a fin passing portion of a heat pipe of the at least one second section with respect to a direction perpendicular to an axial direction of the second axial flow fan.

12. The refrigerator of claim 8, wherein the heat pipes include:
   a first group passing through the first section of each of the fins;
   a second group passing through the first and second second sections of each of the fins; and
   a third group passing through the first and second third sections of each of the fins, wherein the number of heat pipes belonging to the second group and the number of heat pipes belonging to the third group are greater than the number of heat pipes belonging to the first group, and the fin passing portions of the heat pipes belonging to the second group are arranged further away from the base than the fin passing portions of the heat pipes belonging to the first group and are arranged closer to the base than the fin passing portions of the heat pipes belonging to the third group.

13. The refrigerator of claim 12, wherein a separation distance between the fin passing portions of the first section and the first second section is greater than a separation distance between the fin passing portions of the first second section and the first third section with respect to a direction perpendicular to an axial direction of the second axial flow fan.

14. The refrigerator of claim 8, wherein
   the heat dissipation heat sink has a greater heat exchange area than the heat absorption heat sink by a factor of three or more.

15. The refrigerator of claim 8, wherein the thermoelectric module further includes:
   a joint plate that surrounds the thermoelectric element together with the insulator; and
   a heat dissipation cover configured to partially surround the heat dissipation heat sink, wherein the joint plate is provided between the heat absorption heat sink and the insulator or between the heat dissipation heat sink and the insulator, the heat absorption heat sink and the heat dissipation heat sink are fastened to the joint plate, and the rotary shaft of the second axial flow fan is connected to the heat dissipation cover such that the second axial flow fan is spaced away from the heat dissipation heat sink when the heat dissipation cover is disconnected from the thermoelectric module.

* * * * *